United States Patent
Suzuki et al.

(10) Patent No.: US 7,064,974 B2
(45) Date of Patent: Jun. 20, 2006

(54) MAGNETIC RANDOM ACCESS MEMORY AND METHOD FOR MANUFACTURING THE SAME

(75) Inventors: Tetsuhiro Suzuki, Tokyo (JP); Sadahiko Miura, Tokyo (JP)

(73) Assignee: NEC Corporation, Tokyo (JP)

( * ) Notice: Subject to any disclaimer, the term of this patent is extended or adjusted under 35 U.S.C. 154(b) by 220 days.

(21) Appl. No.: 10/659,437

(22) Filed: Sep. 11, 2003

(65) Prior Publication Data

US 2004/0052127 A1    Mar. 18, 2004

(30) Foreign Application Priority Data

Sep. 12, 2002  (JP)  ............................. 2002-267188
Sep. 27, 2002  (JP)  ............................. 2002-284563

(51) Int. Cl.
    *G11C 11/00*   (2006.01)
(52) U.S. Cl. ....................................... 365/158; 365/171
(58) Field of Classification Search ................ 365/158, 365/171, 173
    See application file for complete search history.

(56) References Cited

U.S. PATENT DOCUMENTS 6,236,590 B1    5/2001   Bhattacharyya et al.
6,740,947 B1 *  5/2004   Bhattacharyya et al. .... 257/421
6,982,445 B1 *  1/2006   Tsang ......................... 257/295
2002/0058158 A1 * 5/2002 Odagawa et al. ........... 428/692

FOREIGN PATENT DOCUMENTS

| JP | 2000-82283 A  | 3/2000 |
| JP | 2002-110938 A | 4/2002 |
| JP | 2002-118239 A | 4/2002 |

* cited by examiner

*Primary Examiner*—Vu A. Le
(74) *Attorney, Agent, or Firm*—Sughrue Mion, PLLC

(57) ABSTRACT

A magnetic random access memory is provided including a substrate, a magnetoresistance element which includes a ferromagnetic layer having an invertible spontaneous magnetization, which varies in resistance according to the direction of the spontaneous magnetization, and is formed above the substrate, and a wiring which extends in a first direction and is used for making an electric current flow to generate a magnetic field to be applied to the magnetoresistance element. The wiring is formed so as to pass through a first position which is closer to the substrate than the magnetoresistance element and does not overlap the magnetoresistance element when viewed from a direction perpendicular to the main surface of the substrate, and a second position being above said magnetoresistance element.

13 Claims, 21 Drawing Sheets

FIG. 12
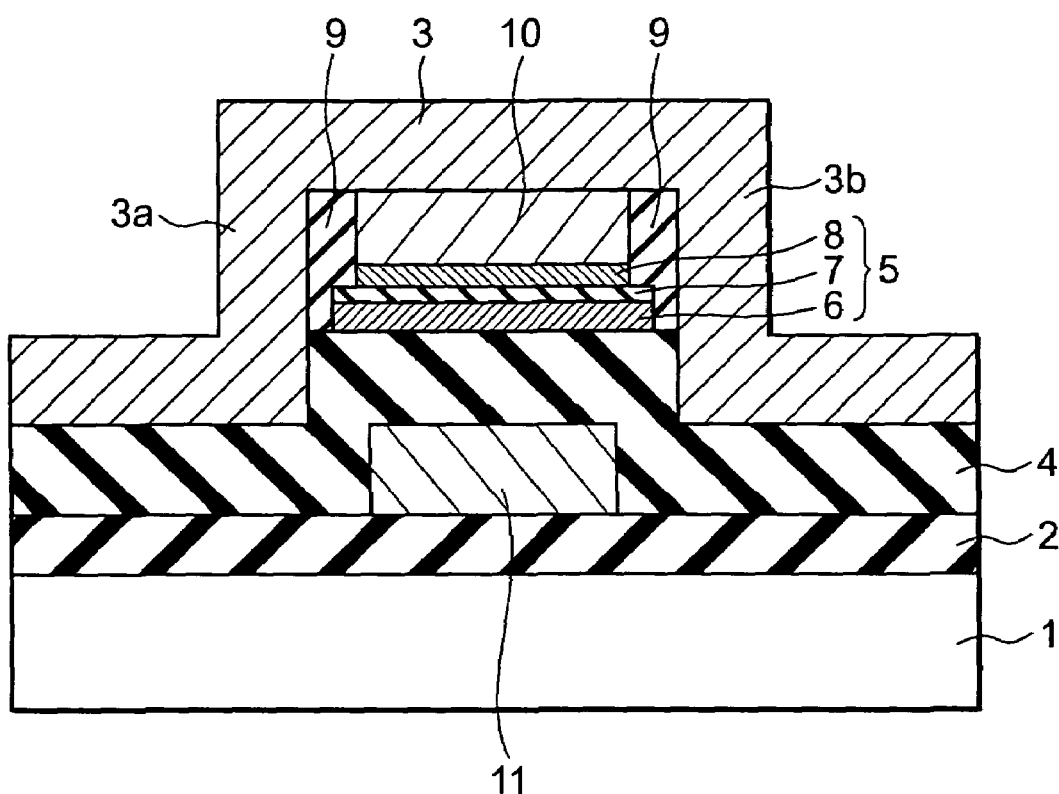
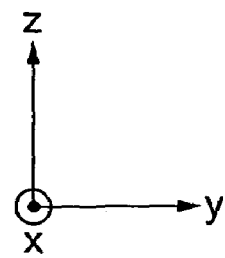

FIG. 18
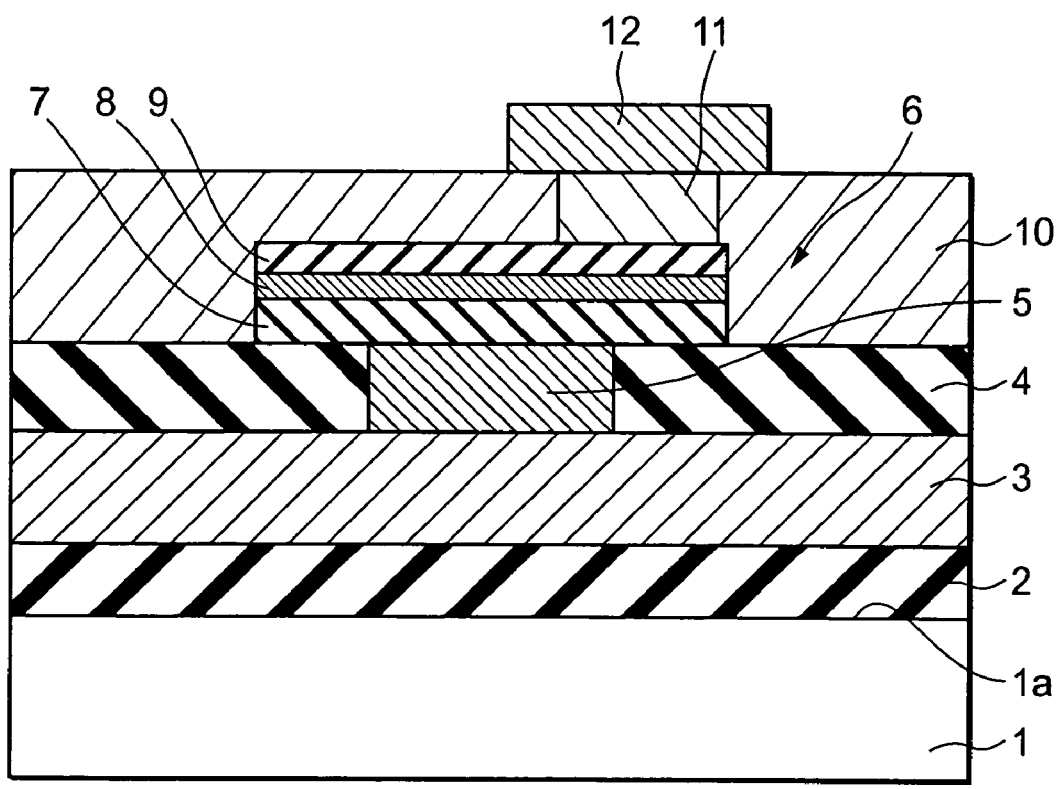
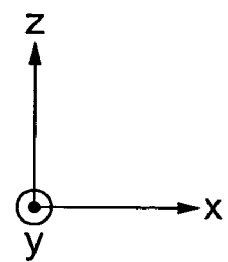

$$P = \frac{d}{L}$$

d: DISTANCE BETWEEN THE CENTER LINE 12A OF THE BIT LINE 12 AND THE MINOR AXIS 9B OF THE FREE FERROMAGNETIC LAYER 9
L: LENGTH OF THE FREE FERROMAGNETIC LAYER 9 IN THE X-AXIS DIRECTION

FIG. 24
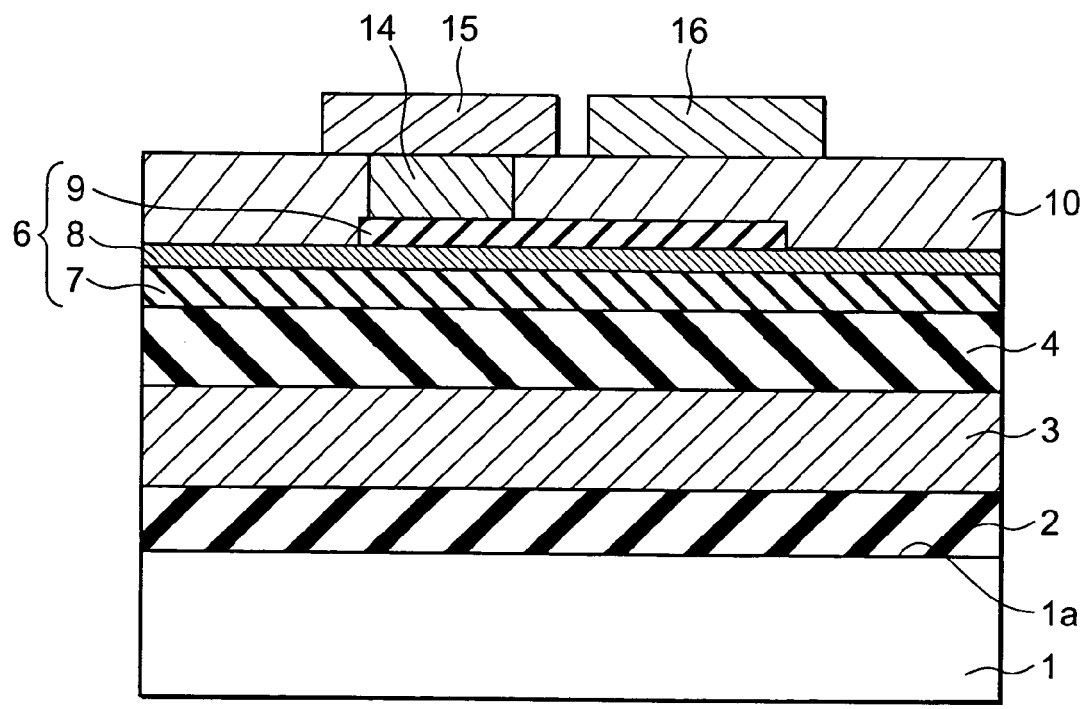
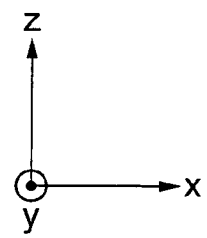

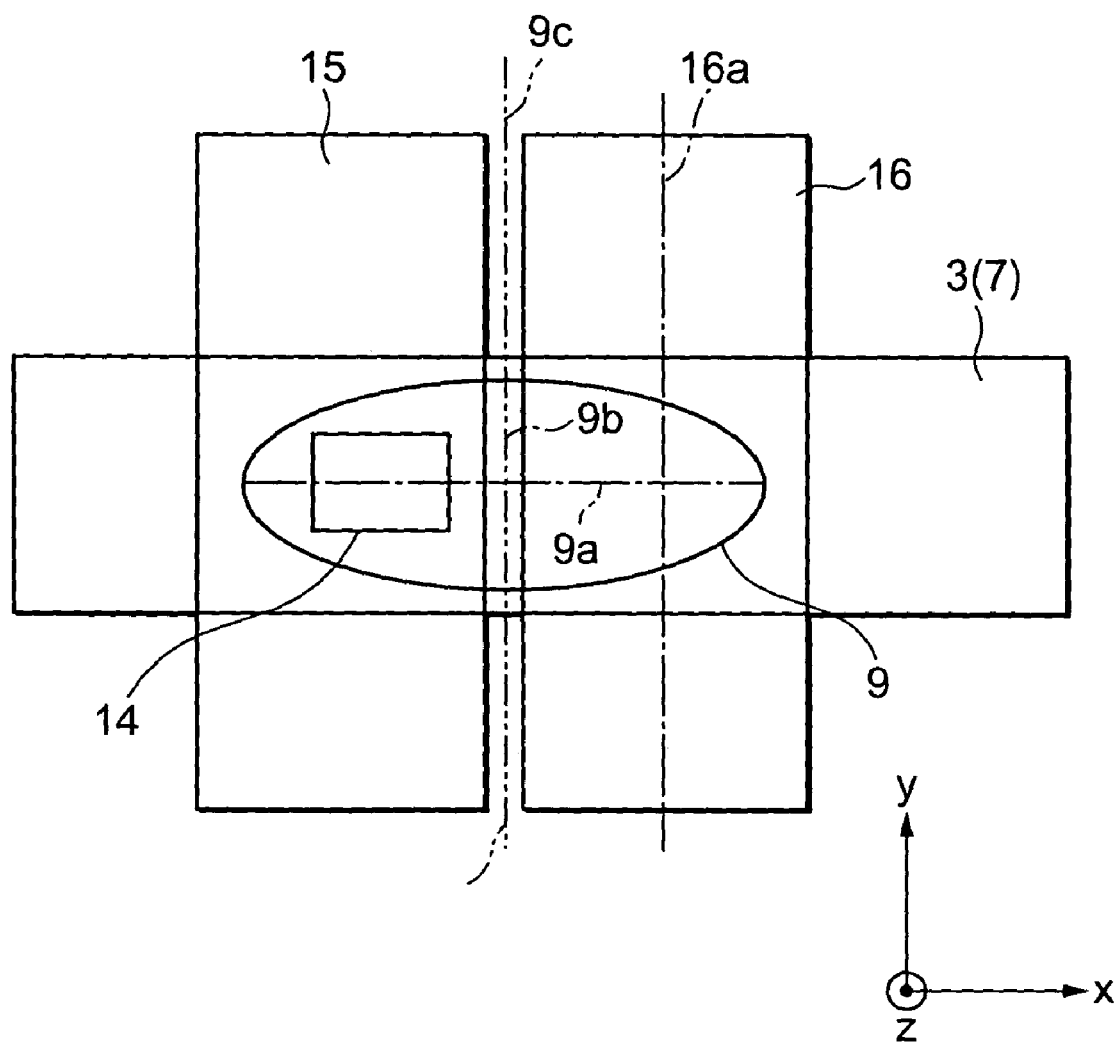

US 7,064,974 B2

MAGNETIC RANDOM ACCESS MEMORY AND METHOD FOR MANUFACTURING THE SAME

BACKGROUND OF THE INVENTION

1. Field of the Invention

The present invention relates to a magnetic random access memory (hereinafter, referred to as "MRAM"). The present invention relates particularly to a technique for making it possible to write data into a memory cell of MRAM by means of a smaller write current.

2. Description of the Related Art

An MRAM has become a key device as a nonvolatile memory which can be written at a high speed and can be rewritten a large number of times.

As shown in FIG. 1, a typical memory cell of MRAM comprises a magnetoresistance element composed of a pin layer 101 having a fixed spontaneous magnetization, a free layer 102 having an invertible spontaneous magnetization and a non-magnetic spacer layer 103 provided between the pin layer 101 and the free layer 102. The free layer 102 is formed so that the direction of its spontaneous magnetization is allowed to be parallel or anti-parallel with the direction of spontaneous magnetization of the pin layer 101.

The memory cell stores data of one bit as the direction of spontaneous magnetization of the free layer 102. The memory cell can take two states including a "parallel" state where the spontaneous magnetization of the free layer 102 and the spontaneous magnetization of the pin layer 101 are parallel with each other and an "anti-parallel" state where the spontaneous magnetization of the free layer 102 and the spontaneous magnetization of the pin layer 101 are anti-parallel with each other. The memory cell stores data of one bit by making one of the "parallel" state and the "anti-parallel" state correspond to "0" and making the other correspond to "1".

A read operation of data from the memory cell is performed by detecting the change in resistance of the memory cell caused by a magnetoresistance effect. The directions of spontaneous magnetization in the pin layer 101 and the free layer 102 have an influence on the resistance of a memory cell. In case that the directions of spontaneous magnetization of the pin layer 101 and the free layer 102 are parallel with each other, the resistance of the memory cell has a first value R, and in case that they are anti-parallel with each other, the resistance of the memory cell has a second value "R+ΔR". The directions of spontaneous magnetization of the pin layer 101 and the free layer 102 enable data stored in a memory cell to be detected by the resistance of the memory cell.

A write operation of data into a memory cell is performed by making a write current flow in a word line and a bit line provided in a memory cell array and inverting the direction of spontaneous magnetization of the free layer 102 by means of a magnetic field generated by said write current.

The reduction of a write current necessary for writing data is important from the viewpoint of reducing the power consumption of MRAM. A technique of reducing a write current has been disclosed in Japanese published application 2002-110938A. In this application, a magnetic field is concentrated at a magnetoresistance element by joining a high-saturation magnetization soft magnetic material or a metal-nonmetal nano-granular film to a signal line in which a write current is made to flow, and thereby a write current is reduced.

Another MRAM having a structure for reducing a write current has been disclosed in U.S. Pat. No. 5,732,016. In the MRAM disclosed in this patent, a coil is used as a wiring in which a write current is made to flow, and a magnetoresistance element is inserted in the coil. Since a magnetic field to be applied to the magnetoresistance element is in proportion to the number of turns of the coil, a write operation can be performed by means of a smaller write current.

Other MRAMs having a structure for reducing a write current have been disclosed in U.S. Pat. No. 6,236,590 and Japanese Patent application 2002-118239. In the MRAM disclosed in U.S. Pat. No. 6,236,590, the width of a conductor in which a write current is made to flow is made smaller than the width of the data storage layer. By making small the width of a conductor in which a write current is made to flow, the misalignment between the conductor and the data storage layer is prevented and the leakage of a magnetic field generated by a write current is reduced and therefore a write operation can be performed by means of a smaller write current.

Furthermore, another technique has been disclosed in Japanese published application 2000-82283A. In a magnetic storage device disclosed in 2000-82283A, a structure having a coupling control layer disposed between two magnetic layers is used. One of the two magnetic layers is used as a storage carrier. In the both magnetic layers, a driving line is provided in a direction parallel with the direction of spontaneous magnetization possessed by the magnetic layers. In case that a write operation of data into the storage carrier is performed, an electric current is made to flow in the driving line and a magnetic field is applied in a direction perpendicular to the direction of spontaneous magnetization possessed by the magnetic layer used as a storage carrier. The inversion of the spontaneous magnetization possessed by the magnetic layer used as a carrier is made selectively easy. The inversion of the spontaneous magnetization possessed by the magnetic layer used as a storage carrier is performed by an exchange interaction acting on the two magnetic layers through the coupling control layer. The driving line in which an electric current is made to flow at the time of a write operation of data is formed so as to be curved upward.

SUMMARY OF THE INVENTION

An object of the present invention is to provide an MRAM memory for making it possible to reduce write current for a write operation of data into an MRAM memory cell.

According to a first aspect of the present invention, a magnetic random access memory comprises a substrate, a magnetoresistance element which includes a ferromagnetic layer having an invertible spontaneous magnetization, which varies in resistance according to the direction of the spontaneous magnetization, and is formed above the substrate, and a wiring which extends in a first direction and is used for making an electric current flow to generate a magnetic field to be applied to the magnetoresistance element, wherein the wiring is formed so as to pass through a first position which is closer to said substrate than the magnetoresistance element and does not overlap the magnetoresistance element in case of being viewed from a direction perpendicular to the main surface of said substrate, and a second position being above said magnetoresistance element.

In the first aspect of the present invention, according to such a structure of the wiring, an electric current made to flow in the wiring has a horizontal current component flowing in a horizontal direction relative to the main surface of the substrate and a vertical current component flowing in a direction perpendicular to the main surface in the vicinity of the magnetoresistance element. A magnetic field generated by the horizontal current component and a magnetic field generated by the vertical current component are added to each other in the magnetoresistance element since they coincide in direction with each other, and the resultant large magnetic field is applied to the magnetoresistance element. Due to this, a write operation of data can be performed by means of a smaller write current.

According to a second aspect of the present invention, a magnetic random access memory comprises a substrate, a ferromagnetic layer having an invertible spontaneous magnetization, and formed above the main surface side of the substrate, a first wiring which extends in a first direction substantially parallel with the substrate and for flowing an electric current to invert the spontaneous magnetization wherein the ferromagnetic layer is substantially symmetrical with respect to a plane of symmetry being substantially perpendicular to the substrate, wherein a centerline of the first wiring is shifted to the plane of symmetry.

According to the second aspect of the present invention, the first wiring for flowing an electric current to invert the spontaneous magnetization generates the largest write magnetic field in the vicinity of the center line of the wiring. The center line of the first wiring being a position where the largest write magnetic field is generated is moved toward the outer edge of the free ferromagnetic layer by arranging the first center line of the first wiring to be offset from the first plane of symmetry of the free ferromagnetic layer. When the first center line is moved close to the outer edge of the free ferromagnetic layer, a write current necessary for inverting a domain in the outer edge of the free ferromagnetic layer is made smaller. When a domain in the outer edge of the free ferromagnetic layer is inverted, the inversion of domain propagates from the outer edge of the free ferromagnetic layer to the center and the spontaneous magnetization of the free ferromagnetic layer is completely inverted. Therefore, by arranging the first center line of the first wiring so as to be offset from the first plane of symmetry of the free ferromagnetic layer, it is possible to make small a write current necessary for inverting the spontaneous magnetization of the free ferromagnetic layer.

BRIEF DESCRIPTION OF THE DRAWINGS

FIG. 12 is another example of the first embodiment of a magnetic random access memory according to the present invention.

FIG. 18 is a sectional view showing a third embodiment of an MRAM memory cell according to the present invention.

FIG. 24 is a sectional view showing a fourth embodiment of an MRAM memory cell according to the present invention.

FIG. 25 is a plan view showing the fourth embodiment of an MRAM memory cell according to the present invention.

DETAILED DESCRIPTION OF THE INVENTION

FIRST EMBODIMENT

Figure 1A:
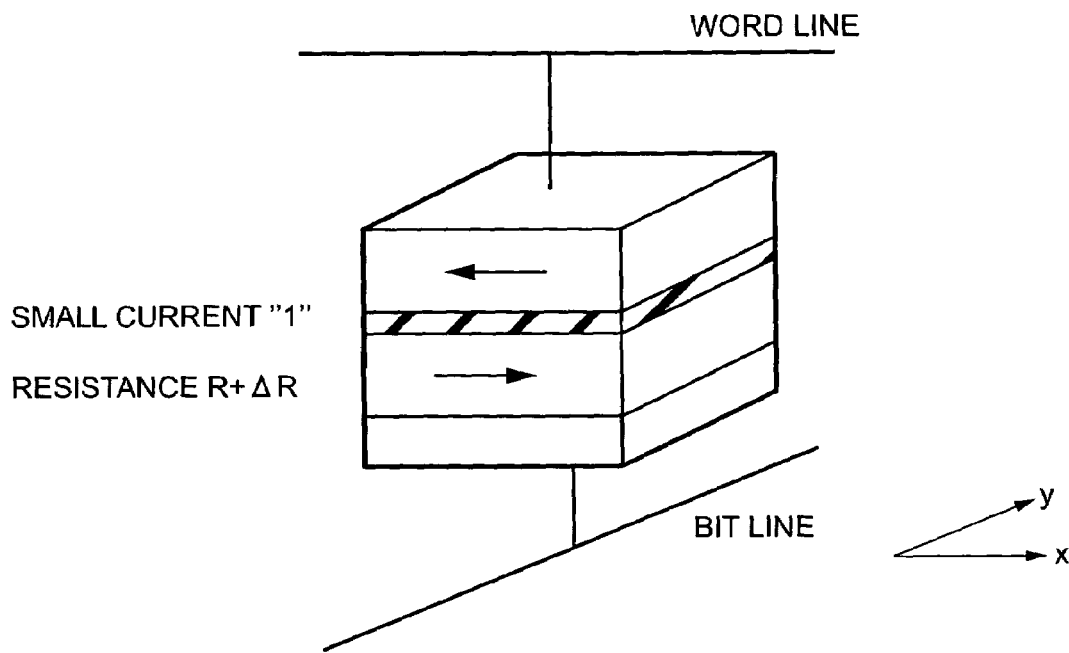
FIGS. 1(a) and (b) are the conventional magnetic random access memory.
Figure 1B:
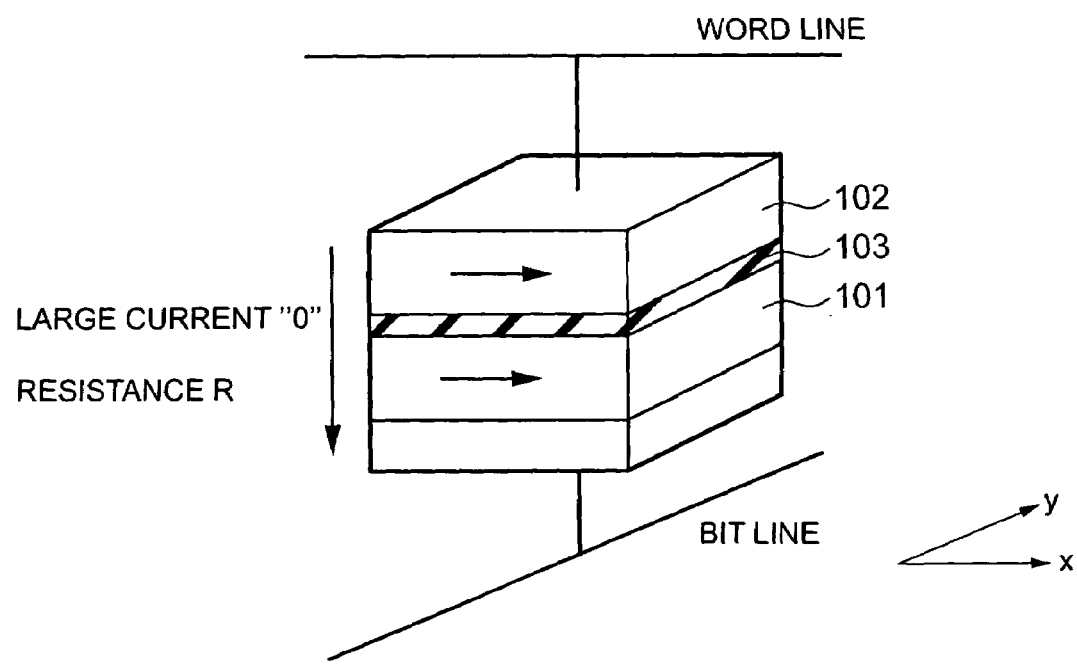
Figure 2:
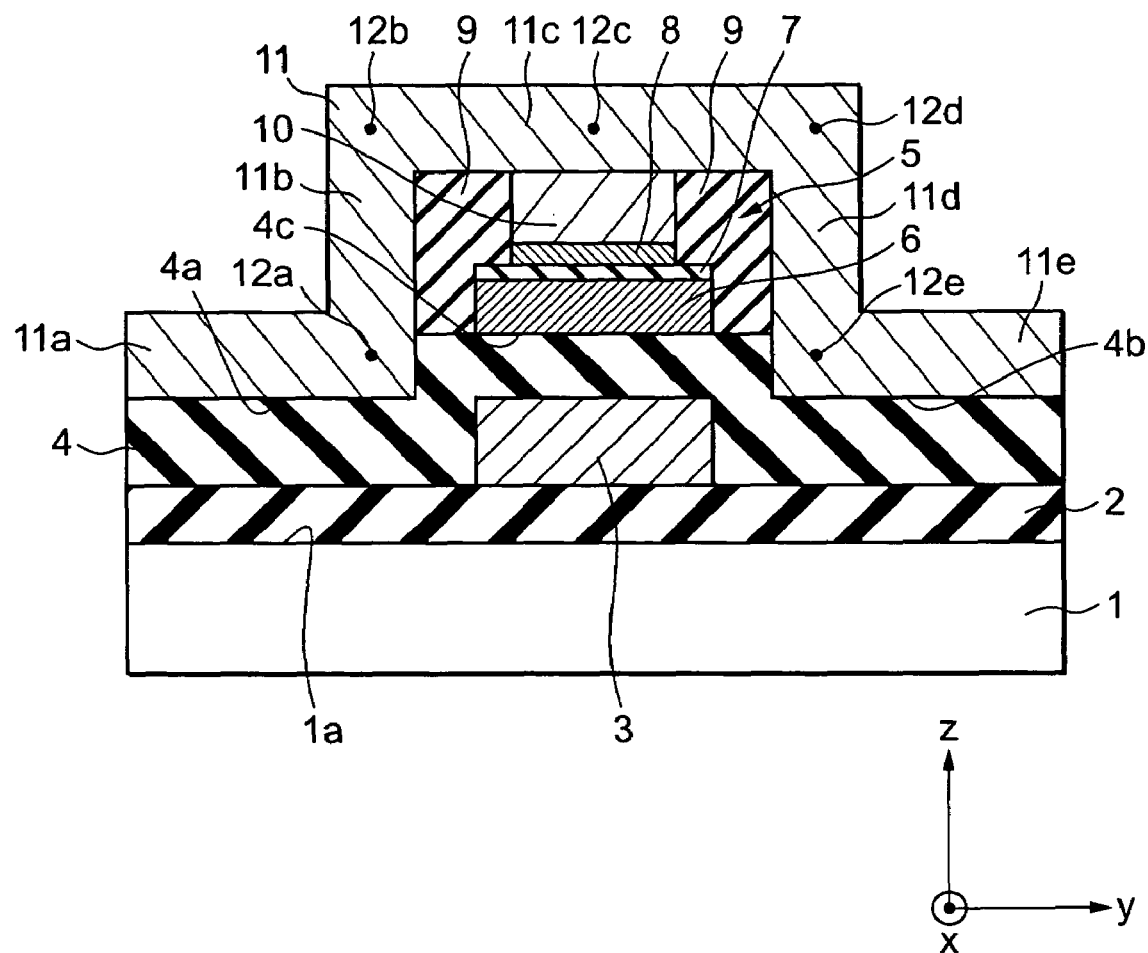
FIG. 2 is a sectional view showing a first embodiment of a magnetic random access memory according to the present invention.
Figure 3:
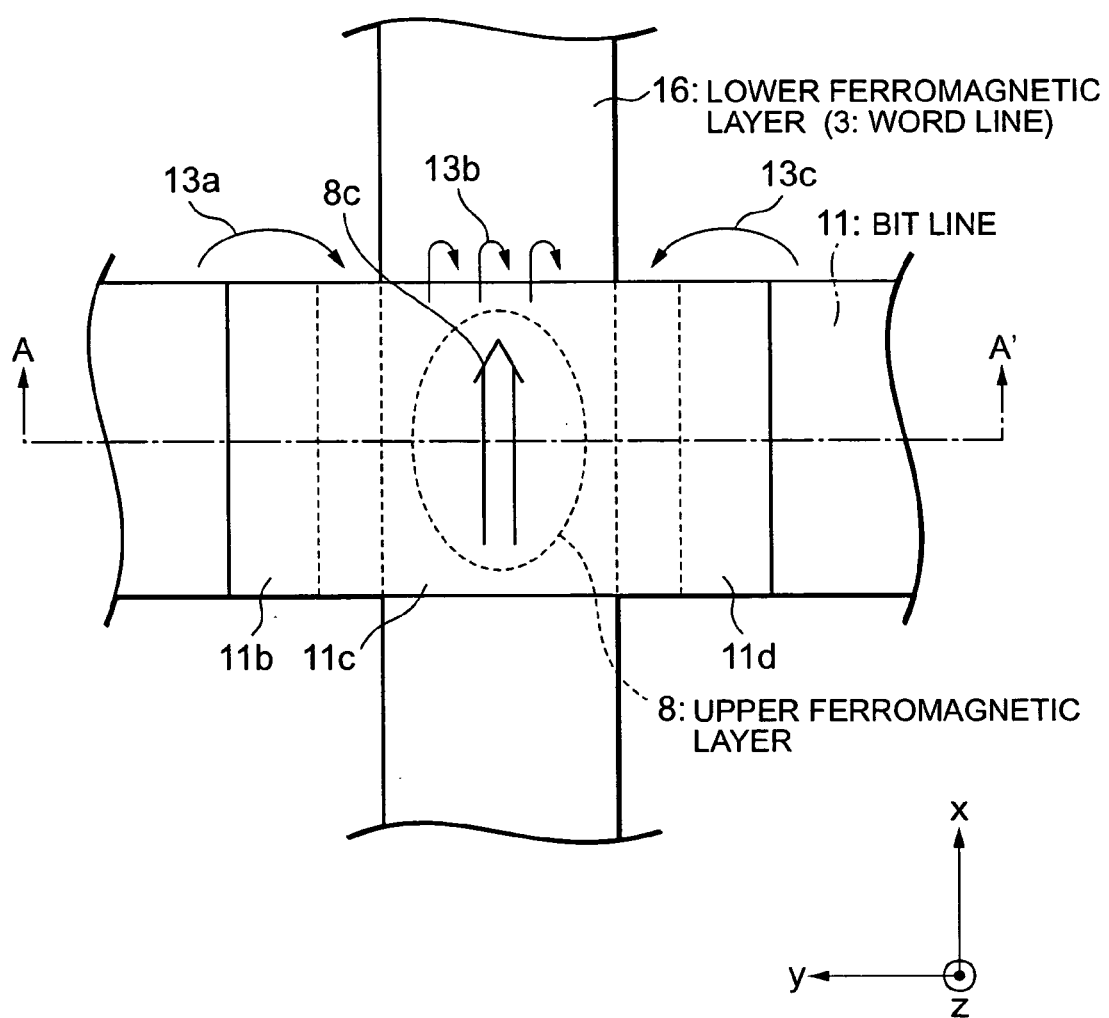
FIG. 3 is a top view showing the first embodiment of a magnetic random access memory according to the present invention.

As shown in FIG. 2, in a first embodiment of MRAM according to the present invention, an interlayer insulator film 2 is formed on the main surface 1a of a substrate 1. A word line 3 is formed on the interlayer insulator film 2. As shown in FIG. 3, the word line 3 is extended in the x-axis direction substantially parallel with the main surface 1a of the substrate 1.

As shown in FIG. 2, the interlayer insulator film 2 and the word line 3 are covered with an interlayer insulator film 4. The interlayer insulator film 4 has wiring forming faces 4a, 4b and a magnetoresistance element forming face 4c. The wiring forming faces 4a, 4b and the magnetoresistance element forming face 4c are substantially parallel with the main surface 1a of the substrate 1. The magnetoresistance element forming face 4c is more distant from the main surface 1a of the substrate 1 than the wiring forming faces 4a and 4b. The word line 3 is located between the magnetoresistance element forming face 4c and the main surface 1a of the substrate 1.

A magnetoresistance element 5 is formed on the magnetoresistance element forming face 4c of the interlayer insulator film 4. The magnetoresistance element 5 comprises a lower ferromagnetic layer 6, a tunnel insulator layer 7 and an upper ferromagnetic layer 8. The lower ferromagnetic layer 6, the tunnel insulator layer 7 and the upper ferromagnetic layer 8 form a magnetic tunnel junction. As shown in FIG. 3, the upper ferromagnetic layer 8 is in the shape of an ellipse having the major axis substantially in the x-axis direction in case of being seen from a direction perpendicular to the main surface 1a of the substrate 1. The lower ferromagnetic layer 6 extends in the x-axis direction and is connected to the word line 3 through a contact formed at a position not illustrated.

Figure 4:
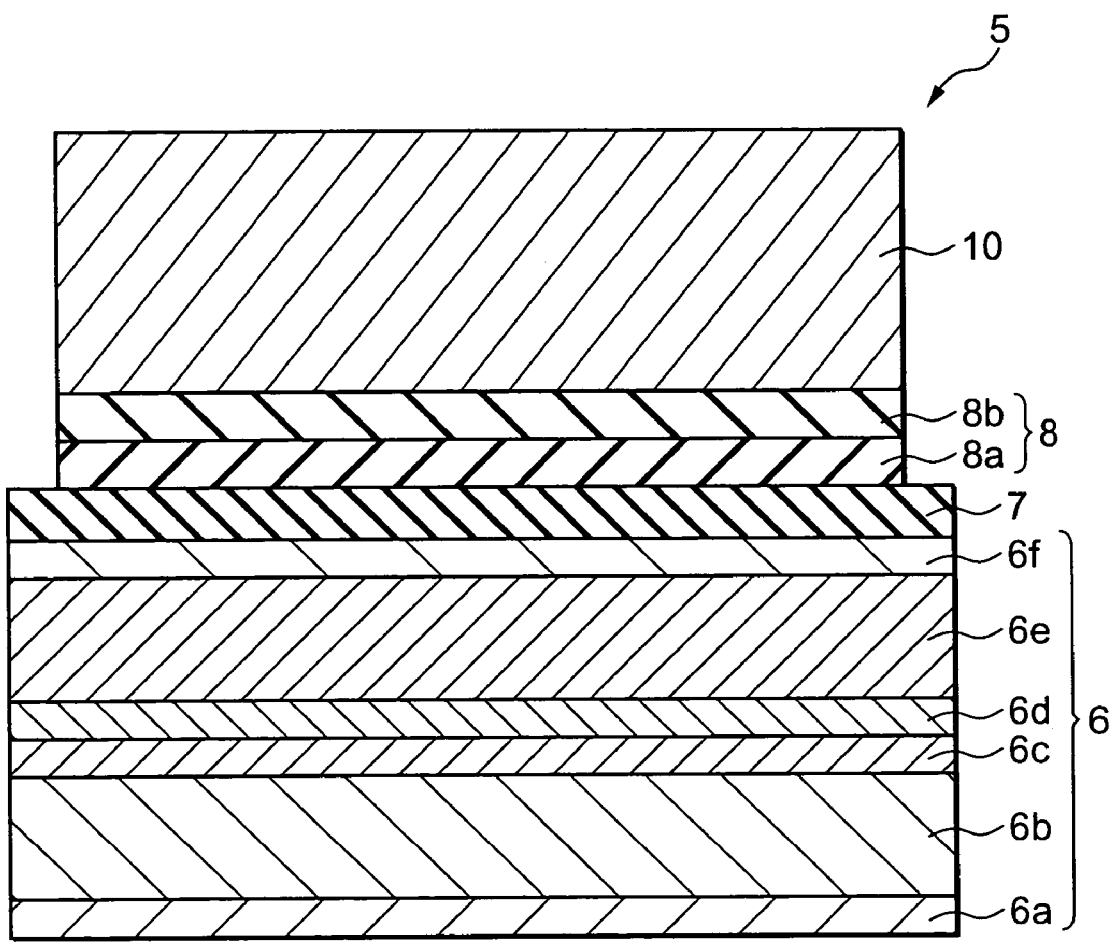
FIG. 4 is a sectional view showing the structure of a magnetoresistance element 5.

FIG. 4 shows a sectional structure of the magnetoresistance element 5. The lower ferromagnetic layer 6 of the magnetoresistance element 5 comprises a first tantalum layer 6a, an aluminum layer 6b, a second tantalum layer 6c, an initial ferromagnetic layer 6d, an antiferromagnetic layer 6e and a fixed ferromagnetic layer 6f which are stacked in order. The first tantalum layer 6a and the second tantalum layer 6c are formed out of tantalum. The aluminum layer 6b is formed out of aluminum. The initial ferromagnetic layer 6d is formed out of permalloy. The antiferromagnetic layer 6e is formed out of Ir—Mn. The fixed ferromagnetic layer 6f is formed out of Co—Fe. The fixed ferromagnetic layer 6f has a spontaneous magnetization and the direction of the spontaneous magnetization is fixed by the interaction received from the antiferromagnetic layer 6e.

The tunnel insulator layer 7 is formed on the fixed ferromagnetic layer 6f of the lower ferromagnetic layer 6. The tunnel insulator layer 7 is so thin that a tunnel current flow in the thickness direction (z-axis direction), and the thickness of the tunnel insulator layer 7 is typically 1 to 3 nm. An alumina ($Al_2O_3$) film made by a plasma oxidation method is used as the tunnel insulator layer 7.

The upper ferromagnetic layer 8 is formed on the tunnel insulator layer 7. The upper ferromagnetic layer 8 comprises a free ferromagnetic layer 8a and a tantalum layer 8b formed on the free ferromagnetic layer 8a. As shown in FIG. 3, the free ferromagnetic layer 8a has a spontaneous magnetization 8c being freely invertible in the +x direction or the −x direction. In the magnetic random access memory, data is stored as a direction of the spontaneous magnetization 8c of the free ferromagnetic layer 8a. Referring to FIG. 4, the resistance in the thickness direction of the tunnel insulator layer 7 varies according to a direction of the spontaneous magnetization 8c of the free ferromagnetic layer 8a. It is possible to discriminate data stored in the said magnetic random access memory by detecting a change of this resistance. In an illustrative embodiment, the free ferromagnetic layer 8a is formed out of Ni—Fe, and the tantalum layer 8b is formed out of tantalum.

The magnetoresistance element forming face 4c of the interlayer insulator film 4 and the magnetoresistance element 5 are covered with an interlayer insulator film 9. The interlayer insulator film 9 is joined to a side face of the magnetoresistance element 5. A cap layer 10 is formed so as to pass through the interlayer insulator film 9 and reach the upper ferromagnetic layer 8. Wiring forming faces 4a and 4b of the interlayer insulator film 4 are not covered with the interlayer insulator film 9.

A bit line 11 is provided so as to pass above the magnetoresistance element 5 and extend in the y-axis direction. The y-axis direction is a direction being substantially parallel with the main surface 1a of the substrate 1 and substantially perpendicular to the x-axis direction. The bit line 11 is insulated by the interlayer insulator film 9 from the lower ferromagnetic layer 6 of the magnetoresistance element 5. The bit line 11 is electrically connected to the upper ferromagnetic layer 8 of the magnetoresistance element 5 through the cap layer 10.

In case that data is written, a write current is made to flow in the word line 3 and the bit line 11. The write current made to flow in the word line 3 generates a magnetic field in a direction perpendicular to the spontaneous magnetization 8c possessed by the free ferromagnetic layer 8a of the magnetoresistance element 5. When a magnetic field is applied in a direction perpendicular to the spontaneous magnetization 8c, the coercive magnetic field of the free ferromagnetic layer 8a is made small and the inversion of the spontaneous magnetization 8c of the free ferromagnetic layer 8a is made easy. When a write current is made to flow in the bit line 11 in this state, the write current generates a magnetic field in a direction parallel or anti-parallel with the spontaneous magnetization possessed by the free ferromagnetic layer 8a of the magnetoresistance element 5 and inverts the spontaneous magnetization 8c into a desired direction.

In order to reduce a write current made to flow in the bit line 11, the bit line 11 is formed so as to have the following structure. The bit line 11 is formed so as to comprise: (1) a horizontal wiring portion 11a which is formed on the interlayer insulator film 4, extends in the y-axis direction and reaches a first position 12a; (2) a vertical wiring portion 11b which extends along a side face of the interlayer insulator film 9 from the first position 12a in a direction (the z-axis direction) substantially perpendicular to the main surface 1a of the substrate 1 and reaches a second position 12b; (3) a horizontal wiring portion 11c which passes through a third position 12c being above the magnetoresistance element 5 from the second position 12b, extends in the y-axis direction and reaches a fourth position 12d; (4) a vertical wiring portion 1d which extends in the z-axis direction from the fourth position 12d and reaches a fifth position 12e; and (5) a horizontal wiring portion 11e which is formed on the interlayer insulator film 4 and extends in the y-axis direction from the fifth position 12e. The first position 12a and the fifth position 12e are closer to the main surface 1a of the substrate 1 than the magnetoresistance element 5 and are located so as to put the magnetoresistance element 5 between them in case of being seen from above the substrate 1.

When a write current is made to flow in the bit line 11 having such a structure, as shown in FIG. 3, a magnetic field 13a is generated by the vertical wiring portion 11b extending in the z-axis direction, a magnetic field 13b is generated by the horizontal wiring portion 11c extending in the y-axis direction, and a magnetic field 13c is generated by the vertical wiring portion 11d extending in the z-axis direction. The magnetic fields 13a to 13c are added to one another since they coincide in direction with one another in the magnetoresistance element 5 and the resultant large magnetic field is applied to the magnetoresistance element 5. In a conventional MRAM, only a magnetic field corresponding to the magnetic field 13b generated by the horizontal wiring portion 11c extending in the y-axis direction is utilized to write data. The above-mentioned structure of the bit line 11 utilizes effectively a write current and makes it possible to apply a large magnetic field to the magnetoresistance element 5. Therefore, it is possible to write data by means of a smaller write current.

Referring to FIG. 2, a fact that the vertical wiring portion 11b and the vertical wiring portion 11d of the bit line 11 extend in a direction perpendicular to the main surface 1a of the substrate 1 (the z-axis direction) is preferable in that a write current can be more effectively utilized. The vertical wiring portion 11b and the vertical-wiring portion 11d can be made closer to the magnetoresistance element 5 by extending the vertical wiring portion 11b and the vertical wiring portion 11d in the z-axis direction. Due to a fact that the vertical wiring portion 11b and the vertical wiring portion 11d are made closer to the magnetoresistance element 5, a larger magnetic field is applied to the magnetoresistance element 5 and a write current can be further reduced.

Such a structure is effective for a micro-fabricated MRAM, and is more effective particularly for an MRAM micro-fabricated to such a degree that the area of a memory cell is made small and the length of the horizontal wiring portion 11c (namely, the distance between the two ends of the upper face of the interlayer insulator film 9 in the y-axis direction) is made smaller than the length of each of the vertical wiring portions 11b and 11d (namely, the distance between the upper face of the interlayer insulator film 9 and the wiring forming face 4a of the interlayer insulator film 4). In an MRAM micro-fabricated to such a degree, a part of a magnetic field to be applied to the magnetoresistance element 5, said part being provided by the vertical wiring portions 11b and 11d, is made large and a write current can be effectively reduced.

A fact that the first position 12a and the fifth position 12e through which the bit line passes are located closer to the substrate 1 than the magnetoresistance element 5 is preferable in that a write operation of data can be performed by means of a smaller write current. Due to a fact that the first position 12a and the fifth position 12e are located closer to the substrate 1 than the magnetoresistance element 5, the component of a write current flowing perpendicularly to the main surface 1a of the substrate 1 is increased. Due to this, a write current is more effectively utilized and a write operation of data can be performed by means of a smaller write current.

The closer to the substrate 5 the first position 12a and the fifth position 12e are, the larger the component becomes flowing perpendicularly to the main surface 1a of the substrate 1 of a write current made to flow in the bit line 11. It is preferable that the first position 12a and the fifth position 12e should be made close to the substrate 1 to such a degree that a half or more of the intensity of a magnetic field to be applied to the magnetoresistance element 5 is provided by the vertical current component. Such a structure makes it possible to more effectively utilize a write current and perform a write operation of data by means of a smaller write current.

Figure 5:
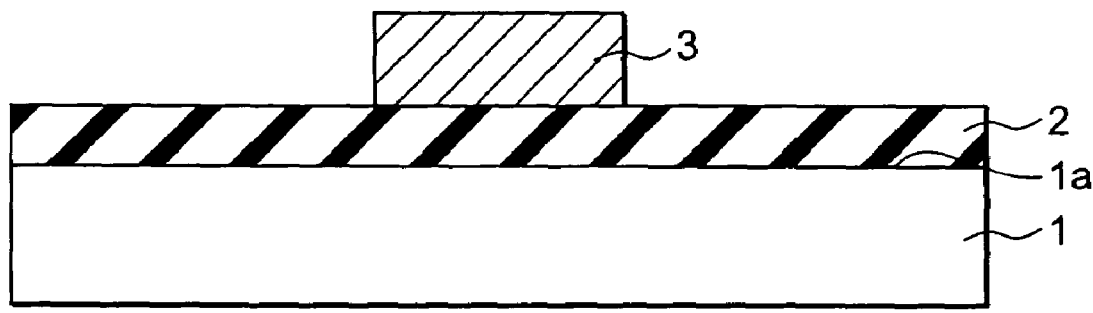
FIG. 5 is a sectional view showing a method for manufacturing a magnetic random access memory of the first embodiment.
Figure 6:
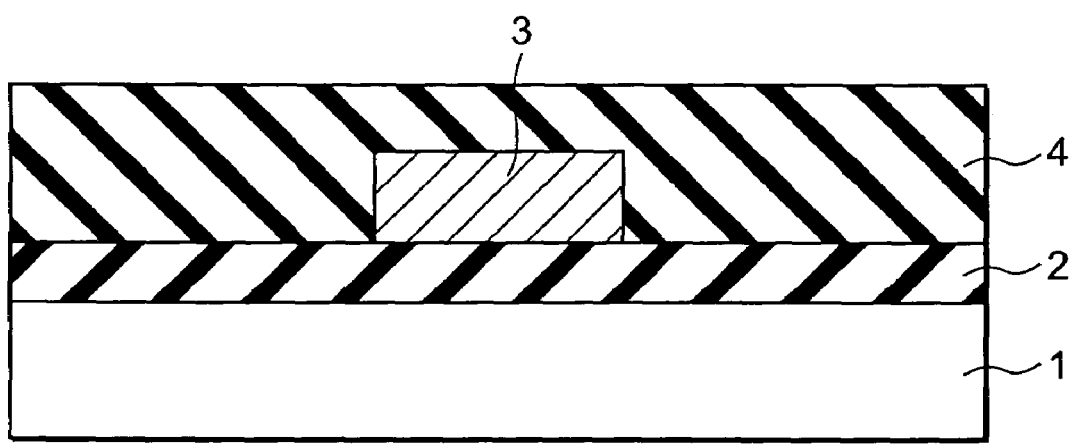
FIG. 6 is a sectional view showing a method for manufacturing a magnetic random access memory of the first embodiment.

FIGS. 5 to 10 show a method for manufacturing an MRAM of the first embodiment of the present invention. This MRAM manufacturing method is started at a process of forming an interlayer insulator film 2 on a substrate 1, as shown in FIG. 5. A word line 3 is formed on the interlayer insulator film 2. Subsequently, as shown in FIG. 6, an interlayer insulator film 4 is formed on the word line 3, and then the surface of the interlayer insulator film 4 is made flat by CMP (chemical mechanical polishing).

Figure 7:
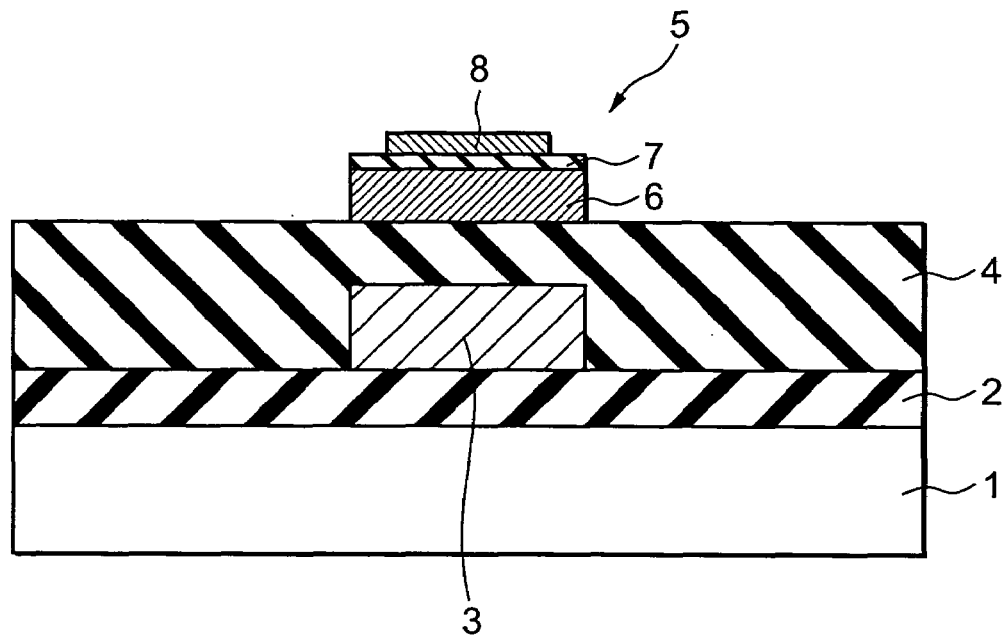
FIG. 7 is a sectional view showing a method for manufacturing a magnetic random access memory of the first embodiment.
Figure 8:
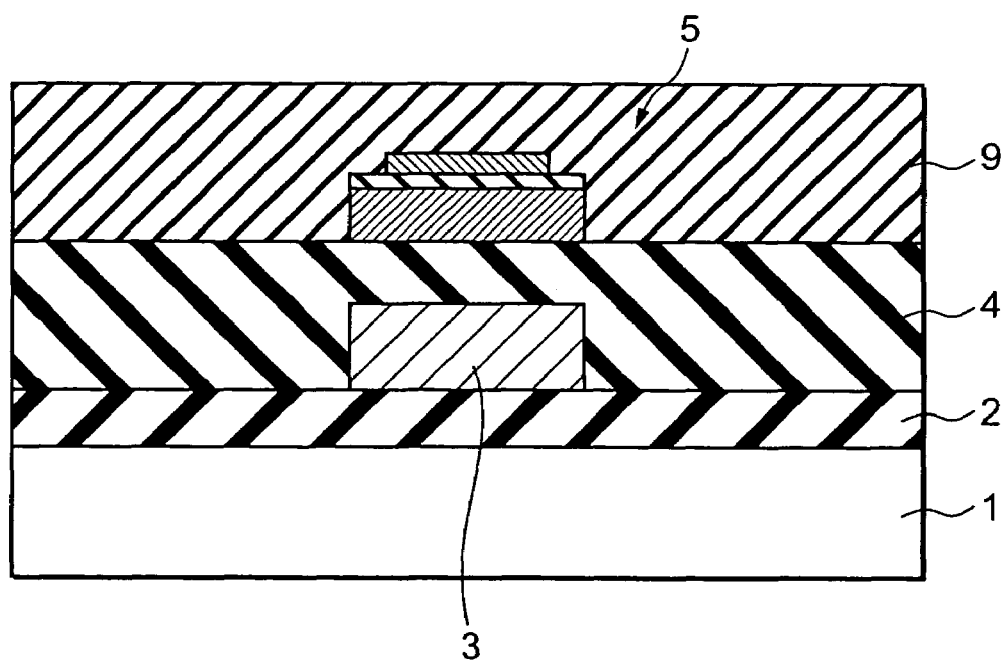
FIG. 8 is a sectional view showing a method for manufacturing a magnetic random access memory of the first embodiment.

After the interlayer insulator film 4 has been made flat, as shown in FIG. 7, a magnetoresistance element 5 is formed on the interlayer insulator film 4. The formation of the magnetoresistance element 5 is performed by a method known by people in this technical field and is not described in detail. Subsequently, as shown in FIG. 8, an interlayer insulator film 9 is formed on the interlayer insulator film 4 and the magnetoresistance element 5 and then the surface of the interlayer insulator film 9 is made flat by CMP.

Figure 9:
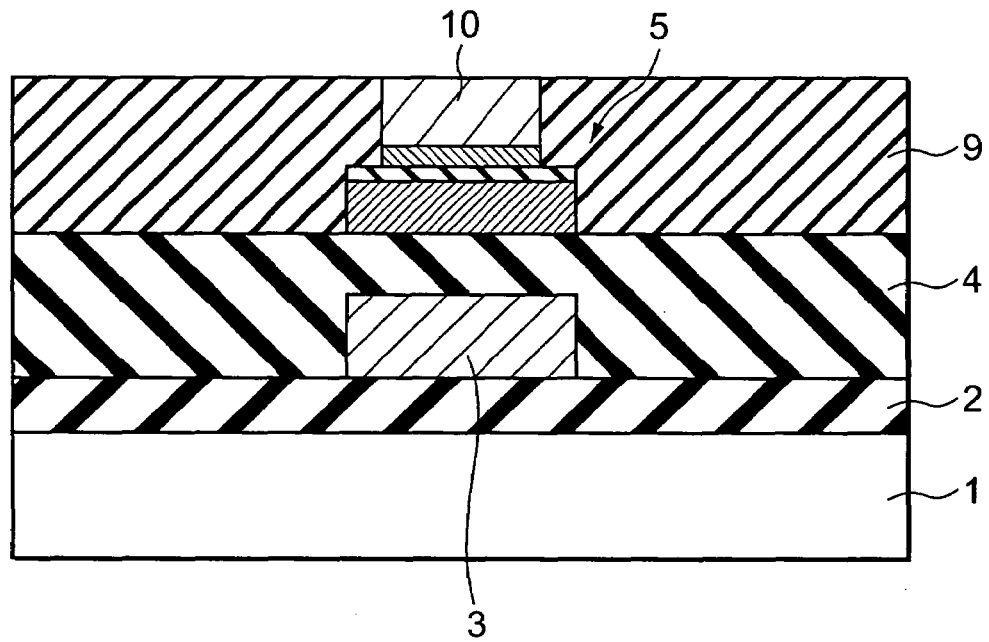
FIG. 9 is a sectional view showing a method for manufacturing a magnetic random access memory of the first embodiment.

Subsequently, as shown in FIG. 9, a contact hole penetrating the interlayer insulator film 9 and reaching the magnetoresistance element 5 is formed and thereafter a cap film 10 in the contact hole.

Figure 10:
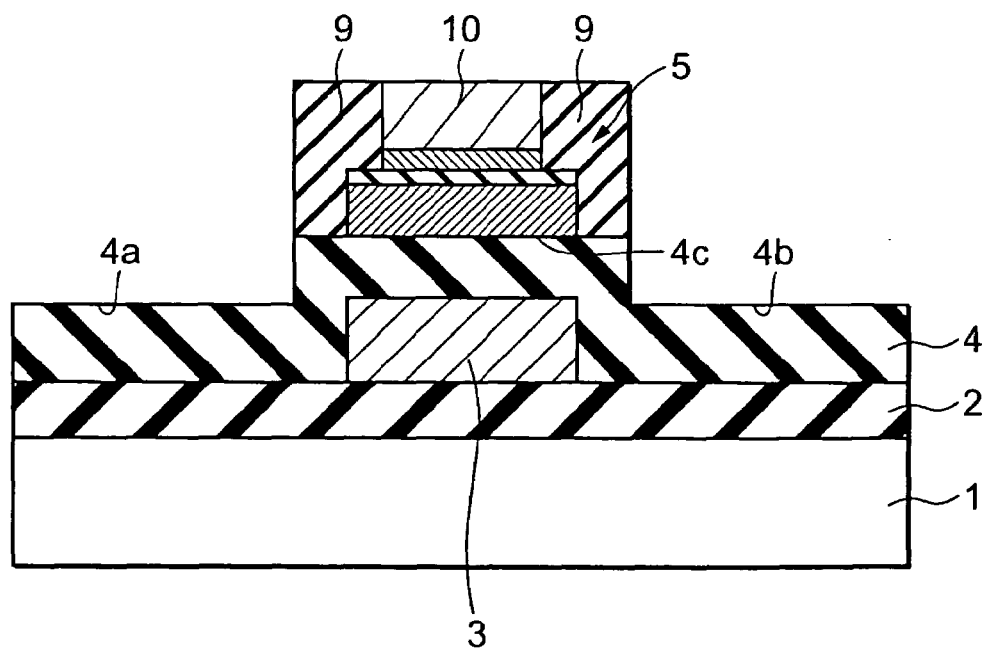
FIG. 10 is a sectional view showing a method for manufacturing a magnetic random access memory of the first embodiment.

After the cap layer 10 is formed, as shown in FIG. 10, the interlayer film 9 and the interlayer film 4 are etched. The etching of the interlayer insulator film 4 is stopped halfway in the interlayer insulator film 4, and thereby, on the interlayer insulator film 4 there are formed wiring forming faces 4a, 4b and a magnetoresistance element forming face 4c being more distant from the main surface 1a of the substrate 1 than the wiring forming faces 4a, 4b. Due to a fact that the interlayer film 9 and the interlayer film 4 are etched, a part of a bit line 11 extending perpendicularly the main surface 1a of the substrate 1 is made longer and a structure intensifying a magnetic field to be applied to the magnetoresistance element 5 is realized. Subsequently, the bit line 11 is formed along the wiring forming faces 4a, 4b and the side and upper faces of the interlayer insulator film 9, and the MRAM shown in FIG. 2 is formed.

As described above, in the MRAM of the first embodiment, due to the above-mentioned structure of the bit line 11, a horizontal current component flowing in a horizontal direction relative to the main surface 1a and a vertical current component flowing in a direction perpendicular to the main surface 1a of the substrate 1 are generated in the vicinity of the magnetoresistance element 5. A magnetic field generated by the horizontal current component and a magnetic field generated by the vertical current component are added to each other since they coincide in direction with each other in the magnetoresistance element 5, and the resultant large magnetic field is applied to the magnetoresistance element 5. Thus, a write operation of data can be performed by means of a smaller write current.

Figure 11:
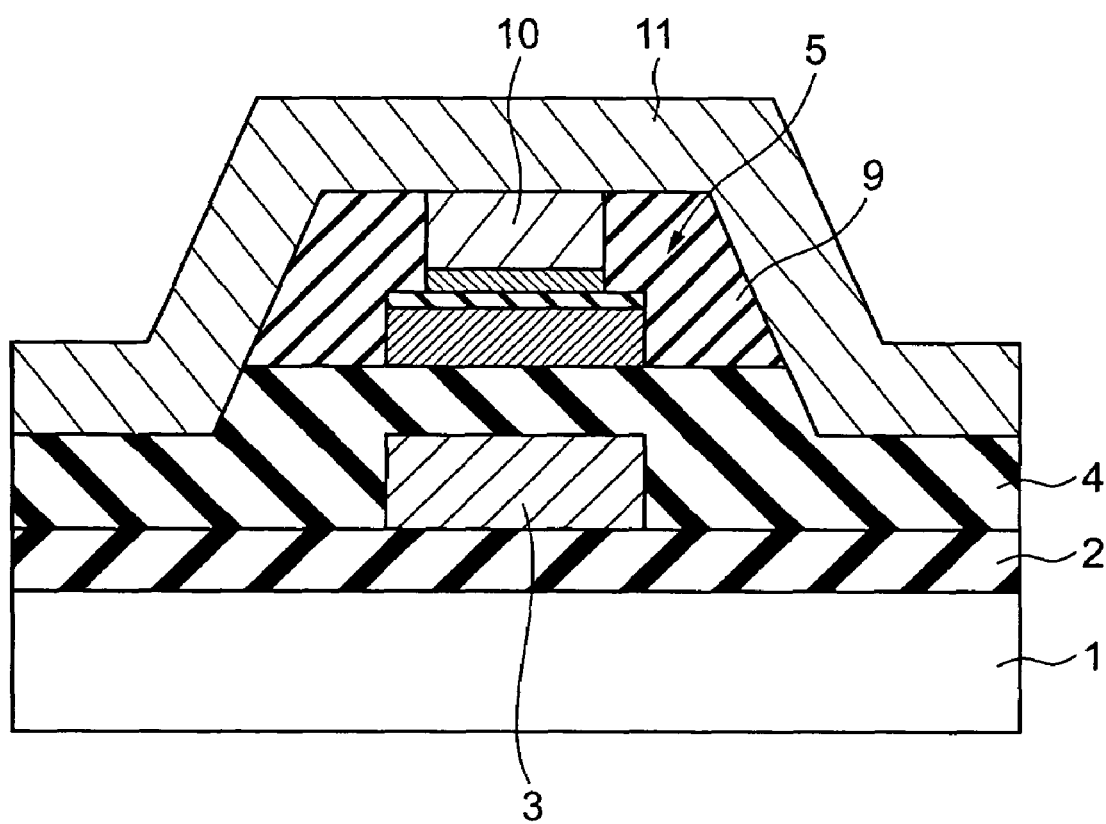
FIG. 11 is another example of the first embodiment of a magnetic random access memory according to the present invention.

In the first embodiment, as shown in FIG. 11, the etching of the interlayer insulator film 9 and the interlayer insulator film 4 can be performed so that the side faces formed by the etching are inclined. Such a structure makes obtuse the angle of bending the bit line 11, effectively prevents the breaking of wire in the bit line 11, and further improves the tolerance to electromigration of the bit line 11.

In the first embodiment, as shown in FIG. 12, it is also possible that a bit line 11 extended in the y-axis direction (namely, a direction perpendicular to the spontaneous magnetization of the upper ferromagnetic layer 8) is formed below the magnetoresistance element 5 and a word line 3 extended in the x-axis direction is formed above the magnetoresistance element 5, and vertical wiring portions 3a, 3b extended in a direction perpendicular to the main surface of the substrate 1 are provided in the word line 3.

As shown in FIG. 2, however, a structure in which vertical wiring portions 11b and 1d extended in a direction perpendicular to the main surface of the substrate 1 provided in the bit line extended in the y-axis direction is more preferable. Since the upper ferromagnetic layer 8 is formed so as to have the major axis 8c in the x-axis direction (namely, the direction of spontaneous magnetization of the upper ferromagnetic layer 8), in the structure of FIG. 12 the distance between the center of the upper ferromagnetic layer 8 and the vertical wiring portion 3*a* or 3*b* of the word line 3 extended in the x-axis direction is made large. Therefore, even if the vertical wiring portions 3*a* and 3*b* are provided in the word line 3, magnetic fields generated by the vertical wiring portions 3*a* and 3*b* are difficult to reach the center of the upper ferromagnetic layer 8. This means that the efficiency of intensifying the magnetic field by the vertical wiring portions 3*a* and 3*b* is low. On the other hand, in the structure of FIG. 2, the distance between the vertical wiring portion 11*b* or 11*d* of the bit line 11 extended in a vertical direction and the center of the upper ferromagnetic layer 8 is made short and the effect of intensifying the magnetic field appears on the whole upper ferromagnetic layer 8. As shown in FIG. 2, therefore, a structure in which the vertical wiring portion 11*b* and 11*d* are provided in the bit line 11 extended in a direction perpendicular to the spontaneous magnetization of the upper ferromagnetic layer 8 is preferable.

Figure 13:
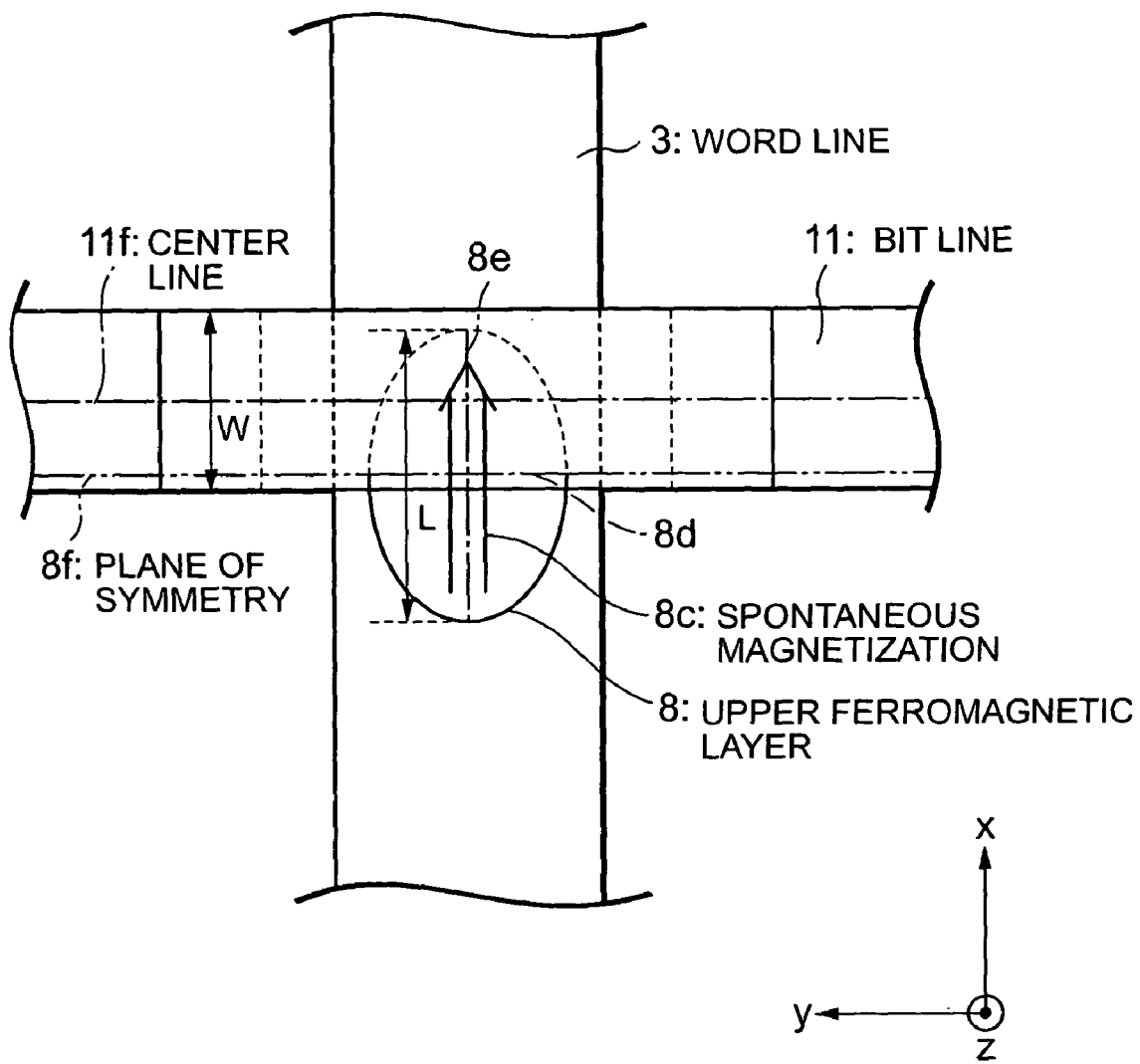
FIG. 13 is another example of the first embodiment of a magnetic random access memory according to the present invention.

Referring to FIG. 13, the upper ferromagnetic layer 8 is symmetric with respect to a plane of symmetry 8*f* being substantially parallel with the y-axis direction and substantially perpendicular to the main surface 1*a* of the substrate 1, but the center line 11*f* of the bit line 11 is preferably arranged so as to be offset in the x-axis direction relative to the plane of symmetry 8*f* of the upper ferromagnetic layer 8. Such arrangement of the bit line 11 makes it possible to further reduce a write current. The effect of reducing a write current obtained due to a fact that the center line 11*f* of the bit line 11 is offset in the x-axis direction relative to the minor axis 8*d* of the upper ferromagnetic layer 8 is estimated to be caused by the following mechanism.

A domain contained in the free ferromagnetic layer 8*a* of the upper ferromagnetic layer 8 receives an exchange interaction to make the adjacent domains uniform in direction of magnetization. Due to this exchange interaction, the inversion of spontaneous magnetization 8*c* of the free ferromagnetic layer 8*a* shows a behavior that the inversion of spontaneous magnetization is started at domains in the outer edge of the free ferromagnetic layer 8*a* and then propagates to domains in the middle of it. Domains in the middle of the free ferromagnetic layer 8*a* are hindered from being inverted by receiving the exchange interaction from all domains existing around them. On the other hand, since domains in the outer edge of the free ferromagnetic layer 8*a* have regions being not adjacent to other domains, they receive a small exchange interaction from the surrounding domains and are inverted by a comparatively small magnetic field. When the domains in the outer edge are inverted, the inversion of domains adjacent to those domains is also facilitated and they are inverted. In such a way, the inversion of domains is started at the outer edge and propagates to the middle region.

By making the center line 1 1*f* of the bit line 11 offset from the plane of symmetry 8*f* of the upper ferromagnetic layer 8, the position where a magnetic field generated by the bit line 11 becomes the maximum is made closer to the outer edge of the free ferromagnetic layer 8*a* and it is possible to invert domains existing in the outer edge of the free ferromagnetic layer 8*a* by means of a smaller write current. If domains in the outer edge of the free ferromagnetic layer 8*a* are inverted, the inversion of domains propagates from the outer edge to the center and the spontaneous magnetization 8*c* of the free ferromagnetic layer 8*a* is completely inverted. Hence, by making the center line 11*f* of the bit line 11 offset from the plane of symmetry 8*f* of the upper ferromagnetic layer 8 and making the center line 11*f* of the bit line 11 closer to the outer edge of the free ferromagnetic layer 8*a*, it is possible to invert the spontaneous magnetization 8*c* of the free ferromagnetic layer 8*a* by means of a smaller write current.

It is preferable that the bit line 11 should have a portion which protrudes in the x-axis direction from an end of the major axis 8*e* of the upper ferromagnetic layer 8 (namely, a segment 8*e* tying both ends in the x-direction of the upper ferromagnetic layer 8 being in the shape of an ellipse) and does not overlap the upper ferromagnetic layer 8 in case of being seen from a direction perpendicular to the main surface 1*a* of the substrate 1. Such arrangement of the bit line 11 is preferable in the regard of making it possible to invert the spontaneous magnetization 8*c* of the free ferromagnetic layer 8*a* by means of a smaller write current. The arrangement of the bit line 11 protruding in the x-axis direction from the upper ferromagnetic layer 8 makes the position where a magnetic field generated by the bit line 11 becomes the maximum closer to the outer edge of the free ferromagnetic layer 8*a*. Therefore, a write current necessary for inverting domains in the outer edge of the free ferromagnetic layer 8*a* is made smaller and as a result, the magnitude of a write current necessary for inverting the spontaneous magnetization 8*c* of the free ferromagnetic layer 8*a* is also made smaller.

Providing a width W of the bit line 11 in the x-axis direction which is narrower than the length L of the upper ferromagnetic layer 8 in the x-axis direction (namely, length L of the major axis 8*e*) is preferable in the regard of making it possible to invert the spontaneous magnetization 8*c* of the free ferromagnetic layer 8*a* by means of a smaller write current. This effect is brought by a fact that when the width W of the bit line 11 is made narrower, a magnetic field generated by the bit line 11 concentrates at domains in the outer edge of the free ferromagnetic layer 8*a*. Due to a fact that a magnetic field generated by the bit line 11 concentrates at domains in the outer edge of the free ferromagnetic layer 8*a*, a write current necessary for inverting domains in the outer edge of the free ferromagnetic layer 8*a* is made smaller. As a result, the magnitude of a write current necessary for inverting the spontaneous magnetization 8*c* of the free ferromagnetic layer 8*a* is also made smaller.

Figure 14:
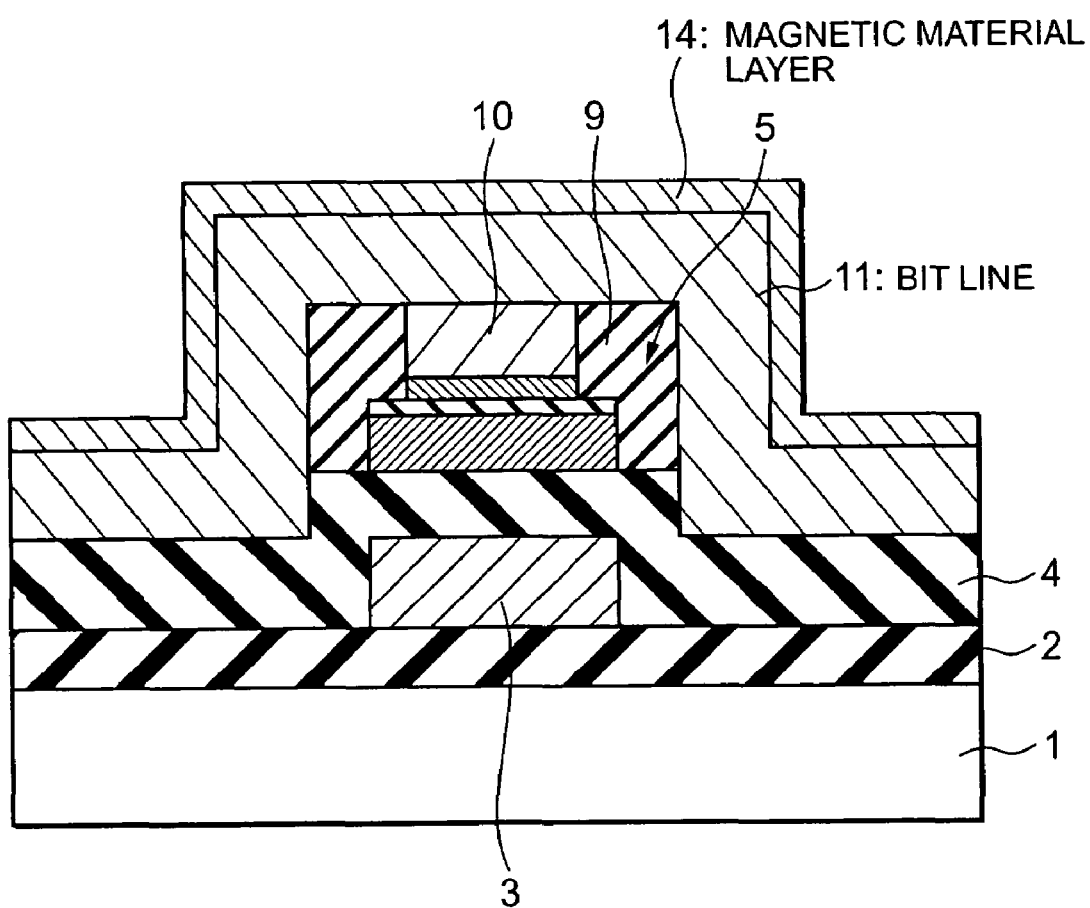
FIG. 14 is another example of the first embodiment of a magnetic random access memory according to the present invention.

Further, in the first embodiment, as shown in FIG. 14, a magnetic material layer 14 being high in magnetic permeability can be formed on the bit line 11. The magnetic material layer 14 is typically formed out of permalloy. Such a structure makes it possible to attract a magnetic field generated by the bit line 11 to the bit line 11, concentrate the magnetic field at the magnetoresistance element 5 and apply a large magnetic field to the magnetoresistance element 5.

SECOND EMBODIMENT

In a second embodiment, a word line having a structure different from the word line 3 of the first embodiment is used in order to further reduce a write current.

Figure 15:
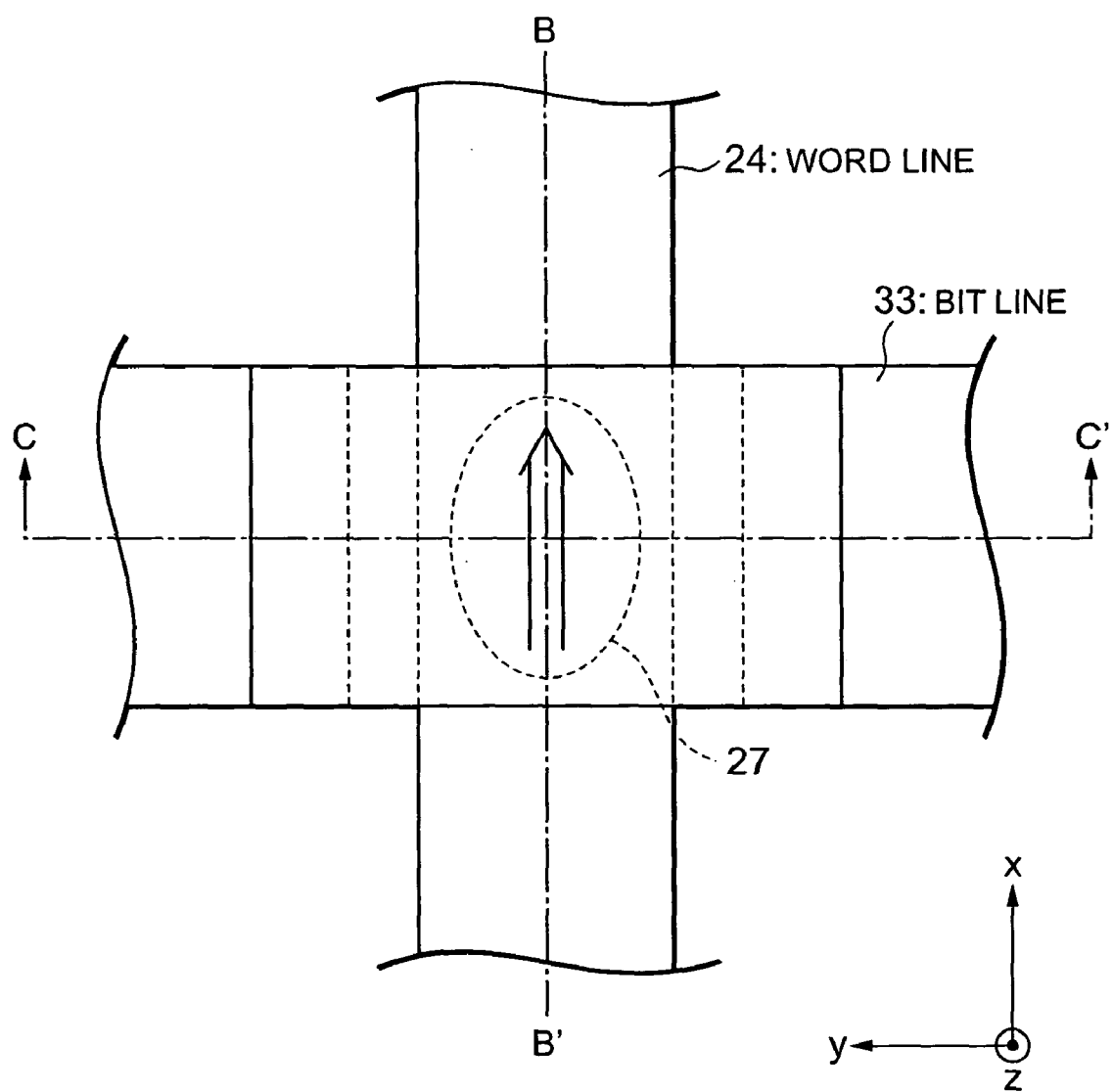
FIG. 15 is a plan view showing a second embodiment of a magnetic random access memory according to the present invention.

In the second embodiment, as shown in FIG. 15, a word line 24 is provided in the x-axis direction and a bit line 33 is provided in the y-axis direction. A magnetoresistance element 27 is provided at a position at which the word line 24 and the bit line 33 intersect with each other.

Figure 16:
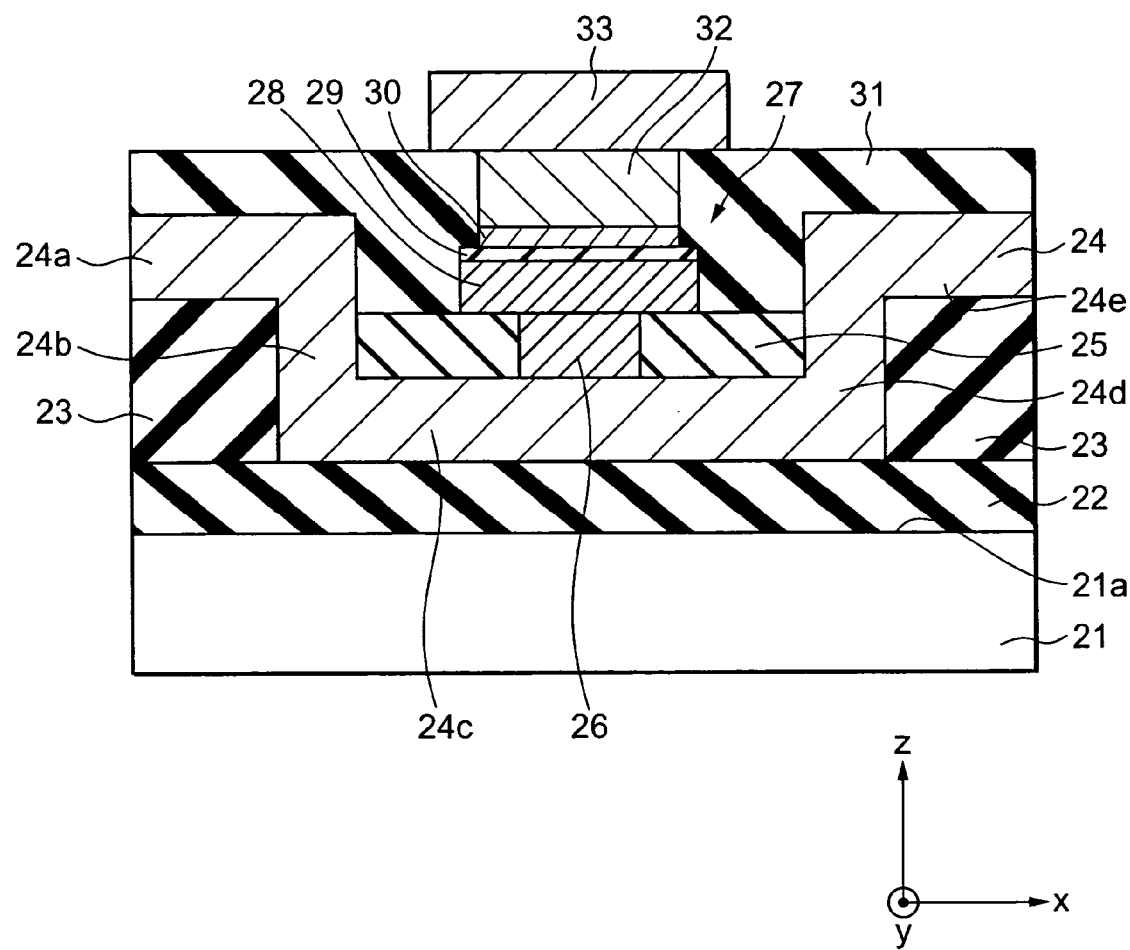
FIG. 16 is a sectional view showing the second embodiment of a magnetic random access memory according to the present invention and is a sectional view taken along line B–B' of FIG. 15.

FIG. 16 shows a sectional structure of an RAM of the second embodiment taken along line B–B' passing through the magnetoresistance element 27 and being parallel with the x-z plane. An interlayer insulator film 22 is formed on the main surface 21*a* of a substrate 21. A hollow forming insulator film 23 is formed on the interlayer insulator film 22. The hollow forming insulator film 23 has an opening formed by etching a part of it, said opening reaching the interlayer insulator film 22.

The word line 24 is formed so as to extend in the x-axis direction. The word line 24 is formed along the upper and side faces of the hollow forming insulator film 23 and the upper face of the interlayer insulator film 22. That is to say, the word line 24 is formed so as to comprise: (1) a horizontal wiring portion 24a which is formed on the hollow forming insulator film 23 and extends in the x-axis direction along the upper face of the interlayer insulator film 23; (2) a vertical wiring portion 24b which is connected with the horizontal wiring portion 24a, extends from the position of connection with the wiring portion 24a along a side face of the hollow forming insulator film 23 in a direction substantially perpendicular to the main surface 1a of the substrate 1 (the z-axis direction), and reaches the interlayer insulator film 22; (3) a horizontal wiring portion 24c which is connected with the vertical wiring portion 24b and extends along the upper face of the interlayer insulator film 22 in the x-axis direction; (4) a vertical wiring portion 24d which is connected with the horizontal wiring portion 24c and extends along a side face of the hollow forming insulator film 23 in a direction substantially perpendicular to the main surface 1a of the substrate 1 (the z-axis direction); and (5) a horizontal wiring portion 24e which is connected with the vertical wiring portion 24d and extends along the upper face of the hollow forming insulator film 23 in the x-axis direction.

Such a structure of the word line 24 makes it possible to more effectively utilize a write current, apply a large magnetic field to the magnetoresistance element 27 and write data by means of a smaller write current. When a write current is made to flow in the word line 24, the vertical wiring portion 24b, the horizontal wiring portion 24c and the vertical wiring portion 24d each generate a magnetic field. The respective magnetic fields generated by the vertical wiring portion 24b, the horizontal wiring portion 24c and the vertical wiring portion 24d coincide substantially in direction with one another in the magnetoresistance element 27. Therefore, the magnetic fields generated by the vertical wiring portion 24b, the horizontal wiring portion 24c and the vertical wiring portion 24d are added to one another and the resultant large magnetic field is applied to the magnetoresistance element 27. Accroding to this, a write current is more effectively utilized and a large magnetic field is applied to the magnetoresistance element 27. Therefore, a write operation of data can be performed by means of a smaller write current.

Figure 17:
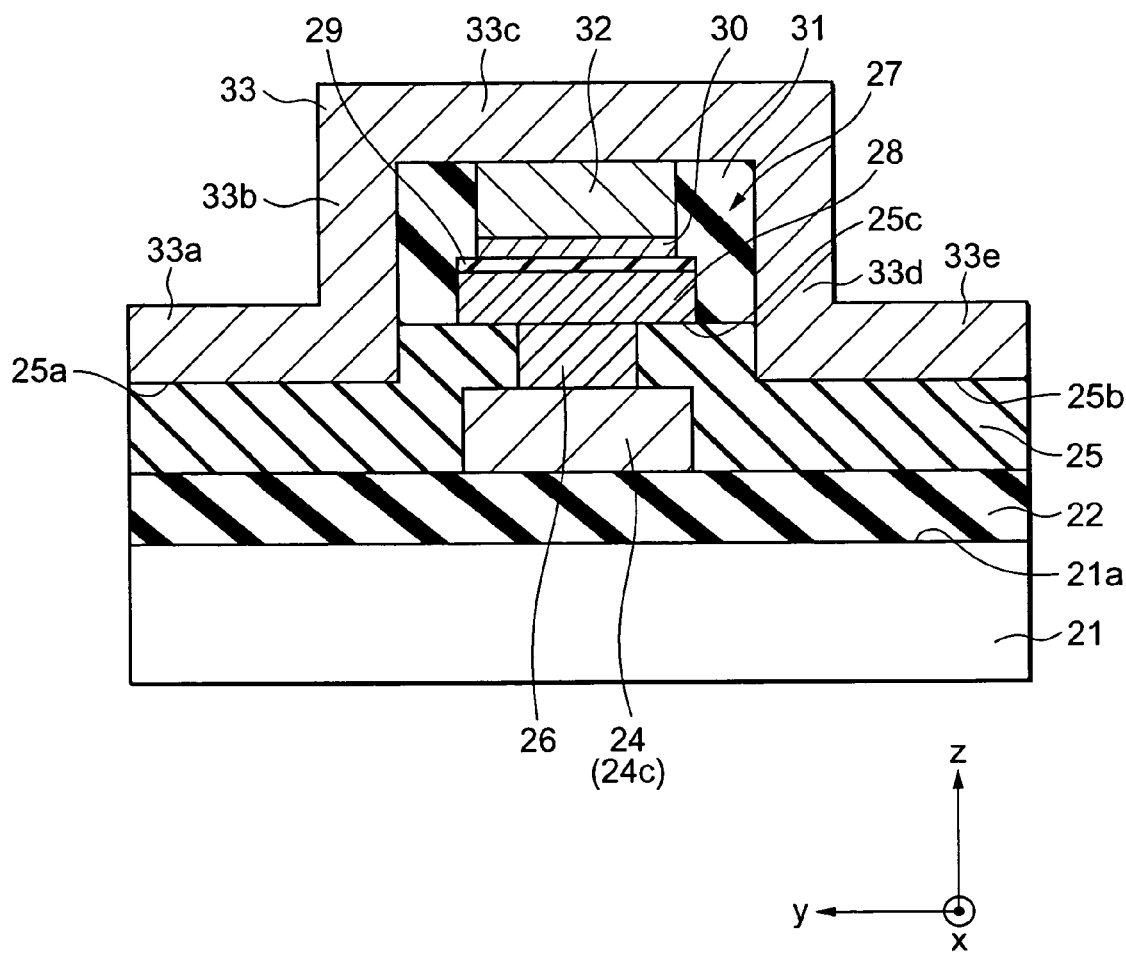
FIG. 17 is a sectional view showing the second embodiment of a magnetic random access memory according to the present invention and is a sectional view taken along line C–C' of FIG. 15.

An interlayer insulator film 25 is formed so as to cover the horizontal wiring portion 24c of the word line 24. With reference to FIG. 17 showing a sectional structure taken along by line C–C' (a section passing through the magnetoresistance element 27 and being parallel with the y-z plane), the interlayer insulator film 25 has wiring forming faces 25a, 25b and a magnetoresistance element forming face 25c. The wiring forming faces 25a, 25b and the magnetoresistance element forming face 25c are substantially parallel with the main surface 21a of the substrate 21. The magnetoresistance element forming face 25c is more distant from the main surface 21a of the substrate 21 than the wiring forming faces 25a, 25b. The horizontal wiring portion 24c is located between the magnetoresistance element forming face 24c and the main surface 21a of the substrate 21.

An electrically conductive contact 26 reaching the word line 24 from the magnetoresistance element forming face 25c is formed in the interlayer insulator film 25. The magnetoresistance element 27 is formed on the magnetoresistance element forming face 25c. The magnetoresistance element 27 is electrically connected with the word line 24 through the contact 26. The magnetoresistance element 27 comprises a lower ferromagnetic layer 28, a tunnel insulator layer 29 and an upper ferromagnetic layer 30. Sectional structures of the lower ferromagnetic layer 28, the tunnel insulator layer 29 and the upper ferromagnetic layer 30 are the same as the sectional structures of the lower ferromagnetic layer 6, the tunnel insulator layer 7 and the upper ferromagnetic layer 8 of the magnetoresistance element 5 of the first embodiment. The lower ferromagnetic layer 28 comprises a fixed ferromagnetic layer having a spontaneous magnetization 8c fixed in direction and the upper ferromagnetic layer 28 comprises a free ferromagnetic layer having an invertible spontaneous magnetization 8c. As shown in FIG. 15, the magnetoresistance element 27 is in the shape of an ellipse being long substantially in the x-direction in case of being seen from above the substrate 21.

As shown in FIG. 17, the magnetoresistance element forming face 25c of the interlayer insulator film 25 and the magnetoresistance element 27 are covered with an interlayer insulator film 31. The interlayer insulator film 31 is joined to the side faces of the magnetoresistance element 27. A cap layer 32 is formed so as to pass through the interlayer insulator film 31 and reach the upper ferromagnetic layer 30. Wiring forming faces 25a and 25b are not covered with the interlayer insulator film 31.

A bit line 33 is provided so as to pass above the magnetoresistance element 27 and extend in the y-axis direction. The bit line 33 is insulated from the lower ferromagnetic layer 28 of the magentoresistance element 27 by the interlayer insulator film 31. The bit line 33 is electrically connected with the upper ferromagnetic layer 30 of the magnetoresistance element 27 through the cap layer 32.

The structure of the bit line 33 is similar to the structure of the bit line 11 of the first embodiment. The bit line 33 is formed along the wiring forming faces 25a, 25b of the interlayer insulator film 25 and the side and upper faces of the interlayer insulator film 31. That is to say, the bit line 33 is formed so as to comprise: (1) a horizontal wiring portion 33a which is formed on the wiring forming face 25a of the interlayer insulator film 25 and extends in the y-axis direction along the wiring forming face 25a; (2) a vertical wiring portion 33b which is connected with the horizontal wiring portion 33a and extends from the position of connection with the horizontal wiring portion 33a in a direction substantially perpendicular to the main surface 1a of the substrate 1 (the z-axis direction) along a side wall of the interlayer insulator film 31; (3) a horizontal wiring portion 33c which is connected with the vertical wiring portion 33b and extends in the y-axis direction along the upper face of the interlayer insulator film 31; (4) a vertical wiring portion 33d which is connected with the horizontal wiring portion 33c and extends in a direction substantially perpendicular to the main surface 1a of the substrate 1 (the z-axis direction) along a side wall of the interlayer insulator film 31; and (5) a horizontal wiring portion 33e which is connected with the vertical wiring portion 33d and extends in the y-axis direction along the upper face of the wiring forming face 25b of the interlayer insulator film 25.

Similar to the bit line 11 of the first embodiment, such a structure of the bit line 33 makes it possible to more effectively utilize a write current and apply a large magnetic field to the magnetoresistance element 27. Due to this, it is possible to perform a write operation of data by means of a small write current.

As described above, in an MRAM of the second embodiment, due to the structure of the bit line 33, a write current made to flow in the bit line 33 has a horizontal current component flowing in a horizontal direction relative to the main surface 21a of the substrate 21 and a vertical current component flowing in a direction perpendicular to the main surface 21a. Since a magnetic field generated by the horizontal current component and a magnetic field generated by the vertical current component coincide in direction with each other in the magnetoresistance element 27, they are added to each other and the resultant large magnetic field is applied to the magnetoresistance element 27. Due to this, a write current required to flow in the bit line 33 for writing data is made small.

Further, due to the structure of the word line 24, a write current made to flow in the word line 24 has a horizontal current component flowing in a horizontal direction relative to the main surface 21a of the substrate 21 and a vertical current component flowing in a direction perpendicular to the main surface 21a of the substrate 21 in the vicinity of the magnetoresistance element 27. Since a magnetic field generated by the horizontal current component and a magnetic field generated by the vertical current component coincide in direction with each other in the magnetoresistance element 27, they are added to each other and the resultant large magnetic field is applied to the magnetoresistance element 27. Due to this, a write current required to flow in the word line 24 for writing data is made small.

THIRD EMBODIMENT

FIG. 18 shows a third embodiment of an MRAM according to the present invention. In the third embodiment, an interlayer insulator film 2 is formed on the main surface 1a side of a substrate 1. A word line 3 is formed on the interlayer insulator film 2. The word line 3 is provided so as to extend in the x-axis direction substantially parallel with the main surface 1a of the substrate 1. The word line 3 is covered with an interlayer insulator film 4. In the interlayer insulator film 4, there is formed a conductive contact 5 penetrating the interlayer insulator film 4 to reach the word line 3. A magnetoresistance element 6 is formed on the interlayer insulator film 4.

The magnetoresistance element 6 comprises a fixed ferromagnetic layer 7, a tunnel insulating layer 8 and a free ferromagnetic layer 9. The fixed ferromagnetic layer 7 is electrically connected through the contact 5 to the word line 3. The fixed ferromagnetic layer 7 has a spontaneous magnetization fixed in the x-axis direction and the free ferromagnetic layer 9 has a spontaneous magnetization being freely invertible in parallel with the x-axis direction. The spontaneous magnetization of the free ferromagnetic layer 9 is allowed to take a "parallel" state where it is directed in the same direction as that of the spontaneous magnetization of the fixed ferromagnetic layer 7 and an "anti-parallel" state where it is directed in the opposite direction. A memory cell of the first embodiment stores data as the direction of spontaneous magnetization of the free ferromagnetic layer 9. The tunnel insulating layer 8 is made of an insulating material such as alumina ($Al_2O_3$) and the thickness of the tunnel insulating layer 8 is so thin that a tunnel current flows in the direction of thickness. The resistance in the direction of thickness of the tunnel insulating layer 8 (namely, the resistance of the magnetoresistance element 6) changes according to the direction of spontaneous magnetization of the free ferromagnetic layer 9, and the change in resistance of the magnetoresistance element 6 enables data stored in the magnetoresistance element 6 to be discriminated.

Figure 19:
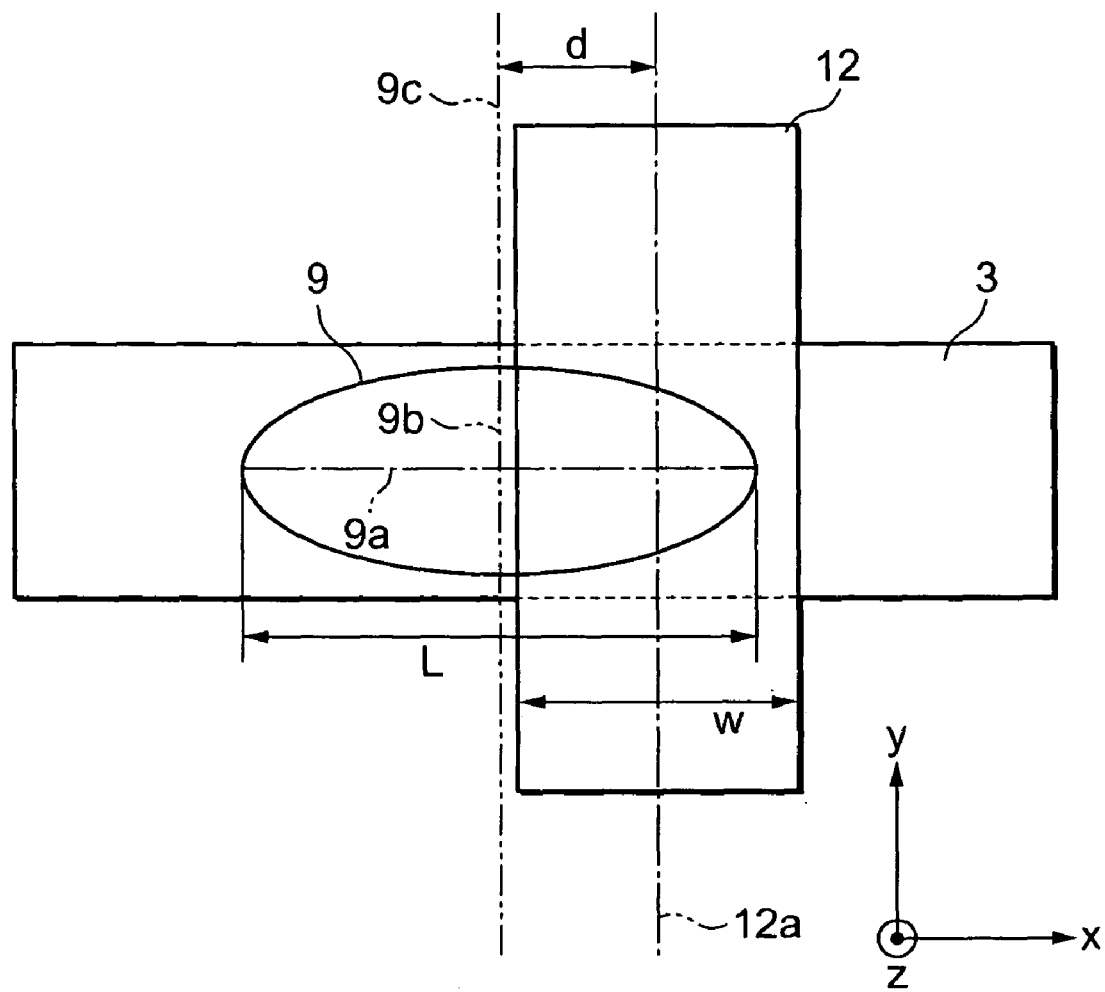
FIG. 19 is a plan view showing the third embodiment of an MRAM memory cell according to the present invention.

As shown in FIG. 19, the free ferromagnetic layer 9 of the magnetoresistance element 6 is substantially elliptic in shape in case of being seen from a direction perpendicular to the main surface 1a of the substrate 1. The free ferromagnetic layer 9 having an elliptic shape has the major axis 9a in the x-axis direction and the minor axis 9b in the y-axis direction being substantially parallel with the primary surface 1a of the substrate 1 and substantially perpendicular to the x-axis direction. The spontaneous magnetization of the free ferromagnetic layer 9 is directed in parallel with the major axis 9a. The free ferromagnetic layer 9 having such a shape is substantially symmetric with regard to a plane of symmetry 9c being perpendicular to the main surface 1 a of the substrate 1 and having the minor axis 9b on it.

As shown in FIG. 18, the magnetoresistance element 6 is covered with an interlayer insulator film 10. In the interlayer insulator film 10, there is formed a conductive contact 11 reaching the free ferromagnetic layer 9. A bit line 12 is formed on the interlayer insulator film 10. The bit line 12 extends in the y-axis direction.

As shown in FIG. 19, the center line 12a of the bit line 12 is arranged so as to be offset in the x-axis direction from the plane of symmetry 9c of the free ferromagnetic layer 9. Further, the bit line 12 has a part which protrudes in the x-axis direction from one end of the major axis 9a of the free ferromagnetic layer 9 in case of being seen from a direction perpendicular to the main surface 1a of the substrate 1 and does not overlap the free ferromagnetic layer 9. Furthermore, the width W of the bit line 12 in the x-axis direction is narrower than the length of the major axis 9a of the free ferromagnetic layer 9 (namely, the length of the free ferromagnetic layer 9 in the x-axis direction).

In case of writing data into the memory cell, a write current is made to flow in the word line in the x-axis direction and a write current is made to flow in the bit line in the y-axis direction according to the data to be written. The write current flowing in the word line 3 applies a magnetic field to the free ferromagnetic layer 9 in the y-axis direction. A magnetic coercive field in the free ferromagnetic layer 9 is made small by applying a magnetic field in the y-axis direction and the inversion of the free ferromagnetic layer 9 is facilitated. When a write current is made to flow in the bit line 12 in this state, this write current generates a magnetic field in the x-axis direction and inverts the spontaneous magnetization of the free ferromagnetic layer 9 in a direction corresponding to the data to be written.

Figure 20:
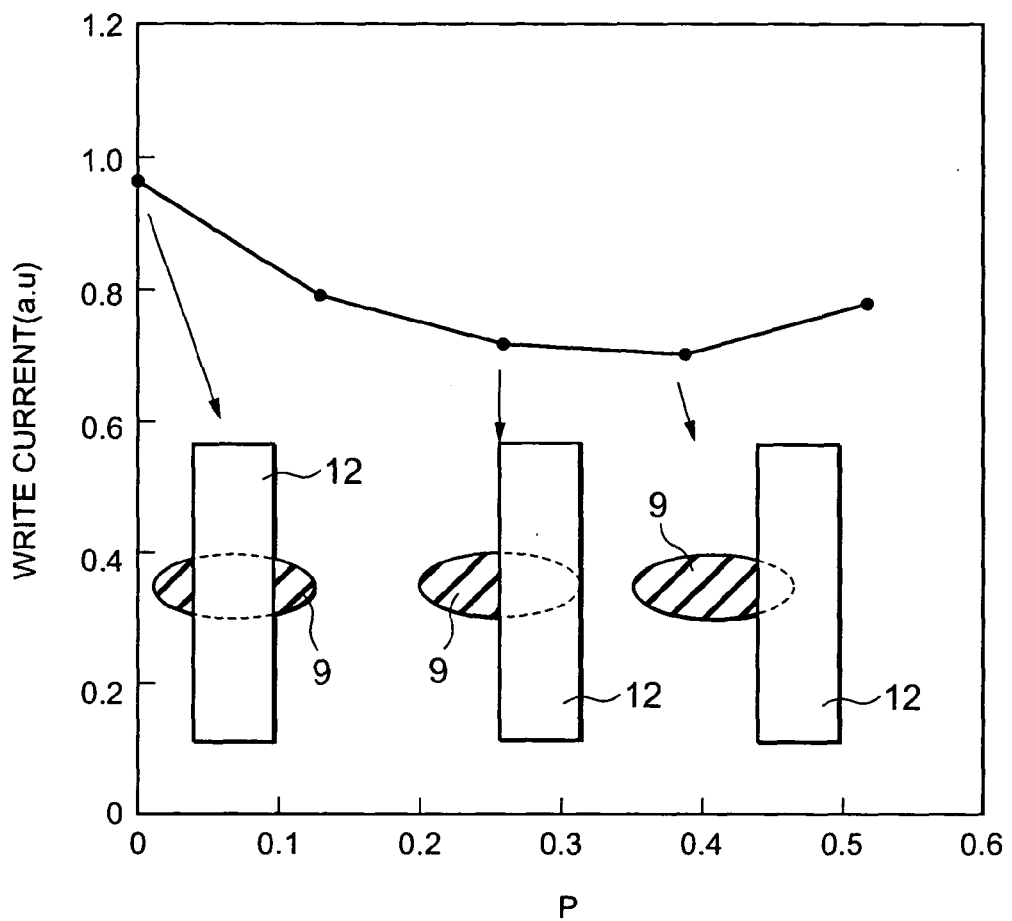
FIG. 20 is a diagram showing a dependency of a magnitude of a write current required to flow in the bit line upon the quantity of offset p.
Figure 21:
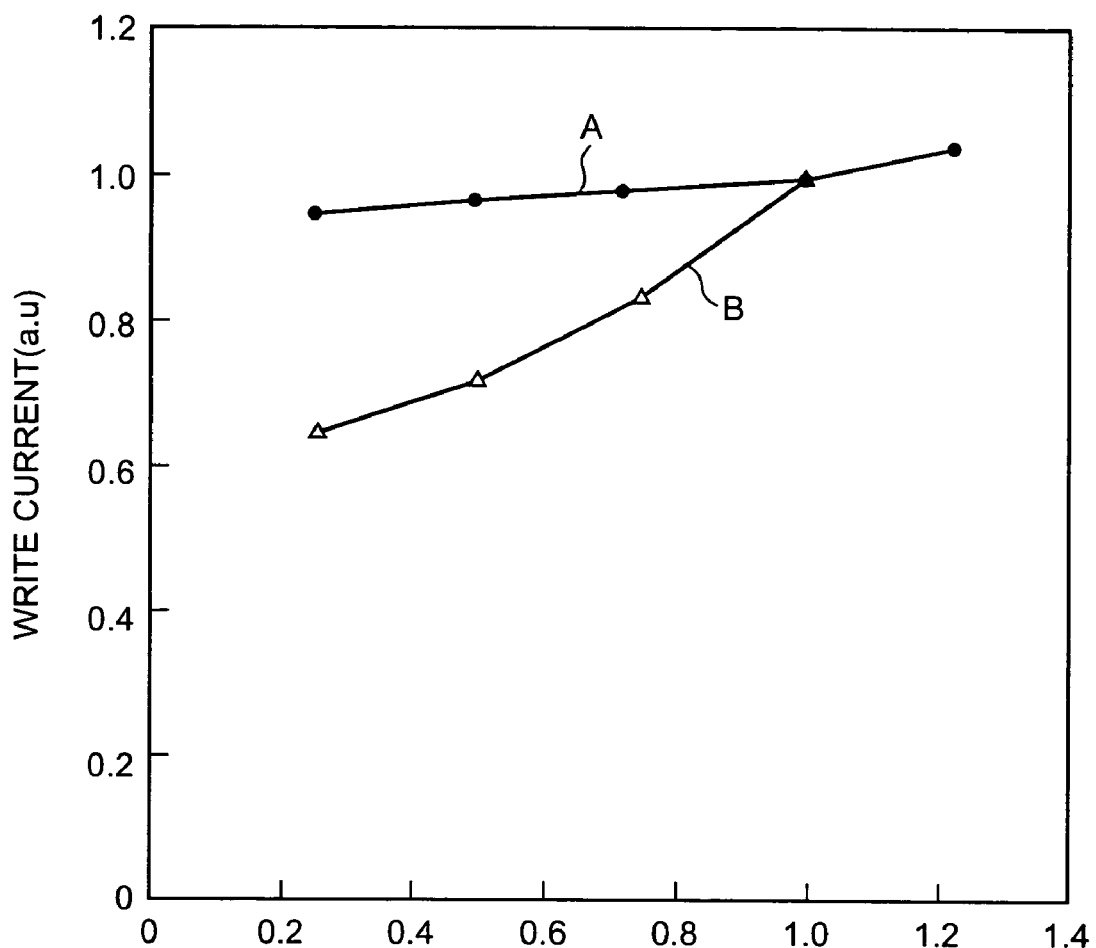
FIG. 21 is a diagram showing a dependency of a magnitude of a write current required to flow in the bit line upon the width W of the bit line.

The above-described arrangement of the bit line 12 makes it possible to write data by means of a smaller write current. FIGS. 20 and 21 show the effect of reducing a write current. FIG. 20 shows dependency of the magnitude of a write current required to flow in the bit line 12 for writing data upon the quantity of offset p between the center line 12a of the bit line 12 and the plane of symmetry 9c of the free ferromagnetic layer 9. The quantity of offset p is defined as: $p=d/L$, where d is the distance between the center line 12a of the bit line 12 and the plane of symmetry 9c and L is a length of the free ferromagnetic layer 9 in the x-axis direction. In case of "p=0", the center line 12a of the bit line 12 is on the plane of symmetry 9c of the free ferromagnetic layer 9, and the larger the quantity of offset p is, the more the center line 12a of the bit line 12 is offset from the plane of symmetry 9c of the free ferromagnetic layer 9. A diagram of FIG. 20 has been obtained by the simulation performed under the condition that the width W of the bit line 12 is half the length L of the free ferromagnetic layer 9.

As shown in FIG. 20, it is possible to write data by means of a smaller write current when the center line 12a of the bit line 12 is offset from the plane of symmetry 9c of the free ferromagnetic layer 9 than a write current when the center line 12a of the bit line 12 is aligned in position with the plane of symmetry 9c of the free ferromagnetic layer 9 (namely, p is zero). When the quantity of offset p is in the vicinity of 0.375, a necessary write current is made minimum in magnitude. The reason for this result is as follows.

A domain contained in the free ferromagnetic layer 9 is subject to an interaction attempting to arrange properly the direction of magnetization of an adjacent domain. According to this interaction, the inversion of spontaneous magnetization of the free ferromagnetic layer 9 is started at a domain at the outer edge of the free ferromagnetic layer 9 and thereafter exhibits a behavior of propagating to domains in the middle. A domain in the middle of the free ferromagnetic layer 9 receives interaction from all domains existing around it and is prevented from its inversion. On the other hand, since a domain at the outer edge of the free ferromagnetic layer 9 has an area having no adjacent domain, it receives a less interaction from domains surrounding it and is inverted by a comparatively small magnetic field. When a domain at the outer edge is inverted, a domain adjacent to this domain is also easily inverted. In this way, the inversion of domain is started at the outer edge and propagated to the center.

By making the center line 12a of the bit line 12 offset from the plane of symmetry 9c of the free ferromagnetic layer 9, the position where a magnetic field generated by the bit line 12 is made maximum moves close to the outer edge of the free ferromagnetic layer 9 and it becomes possible to generate the inversion of domain at the outer edge of the free ferromagnetic layer 9 by means of a smaller write current. By inverting a domain existing at the outer edge of the free ferromagnetic layer 9, the inversion of domain propagates from the outer edge to the center and the spontaneous magnetization of the free ferromagnetic layer 9 is completely inverted. Therefore, by making the center line 12a of the bit line 12 offset from the plane of symmetry 9c of the free ferromagnetic layer 9 to move the center line 12a of the bit line 12 close to the outer edge of the free ferromagnetic layer 9, it is possible to invert the spontaneous magnetization of the free ferromagnetic layer 9 by means of a smaller write current.

However, when the quantity of offset p is made too large, a magnetic field interlinked with the free ferromagnetic layer 9 is made small and inversely, a write current is increased. Therefore, it is preferable that the quantity of offset p is not less than 0.1 and not more than 0.5.

The arrangement of the bit line 12 having a part which protrudes in the x-axis direction from one end of the major axis 9a of the free ferromagnetic layer 9 in case of being seen from a direction perpendicular to the main surface 1a of the substrate 1 is preferable in that this arrangement makes it possible to invert the spontaneous magnetization of the free ferromagnetic layer 9 by means of a further smaller write current. The arrangement of the bit line 12 protruding in the x-axis direction from the free ferromagnetic layer 9 moves the position where a magnetic field generated by the bit line 12 is made maximum closer to the outer edge of the free ferromagnetic layer 9. Therefore, a write current necessary for the inversion of domain at the outer edge of the free ferromagnetic layer 9 is made small and as a result, a write current necessary for the inversion of spontaneous magnetization of the free ferromagnetic layer 9 is also made small in magnitude.

Above mentioned U.S. Pat. No. 6,236,590 and Japanese published application 2002-118239A have disclosed that a misalignment between a wiring in which a write current of data is made to flow and a data storage layer (corresponding to the free ferromagnetic layer 9 of this embodiment) makes a magnetic field leak out and increases a write current. However, this study is wrong since it lacks detailed examination of a mechanism of inverting the spontaneous magnetization of a ferromagnetic material.

A fact that the width W of the bit line in the x-axis direction is narrower than the length L of the free ferromagnetic layer 9 in the x-axis direction is preferable in that the spontaneous magnetization of the free ferromagnetic layer 9 can be inverted by a smaller write current. FIG. 21 shows the dependency of the magnitude of a write current required to flow in the bit line 12 for writing data upon W/L. As shown by curve A in FIG. 21, in case that the center line 12a of the bit line 12 is not offset from the minor axis 9b of the free ferromagnetic layer 9, like the referenced, the effect of reducing a write current due to making less the width W of the bit line 12 is not large. On the other hand, in the invention, as shown by curve B in FIG. 21, in case that the center line 12a of the bit line 12 is offset from the plane of symmetry 9c of the free ferromagnetic layer 9, making less the width W of the bit line 12 can remarkably reduce a write current.

It is conceivable that this effect is caused by a fact that when the width W of the bit line 12 is made narrow a magnetic field generated by the bit line 12 concentrates on domains at the outer edge of the free ferromagnetic layer 9. A write current necessary for inverting domains at the outer edge of the free ferromagnetic layer 9 is reduced by a fact that a magnetic field generated by the bit line 12 concentrates on the domains at the outer edge of the free ferromagnetic layer 9. As a result, it is conceivable that the magnitude of a write current necessary for inverting the spontaneous magnetization of the free ferromagnetic layer 9 is also reduced.

However, a too small width W of the bit line 12 is not preferable for the reason that it deteriorates the tolerance to electromigration. Therefore, it is preferable that the width W of the bit line 12 is not less then 0.3 times and not more than 0.7 times the length L of the free ferromagnetic layer 9.

As described above, in an MRAM memory cell of this embodiment, the center line 12a of the bit line 12 is arranged so as to be offset in the x-axis direction from the plane of symmetry 9c of the free ferromagnetic layer 9. Further, the bit line 12 has a part which protrudes in the x-axis direction from one end of the major axis 9a of the free ferromagnetic layer 9 and does not overlap the free ferromagnetic layer 9. Furthermore, the width W of the bit line 12 in the x-axis direction is narrower than the length of the major axis 9a of the free ferromagnetic layer 9 (namely, the length of the free ferromagnetic layer 9 in the x-axis direction). Such an arrangement of the bit line 12 reduces the magnitude of a write current required to flow in the bit line 12 at the time of writing data.

Figure 22:
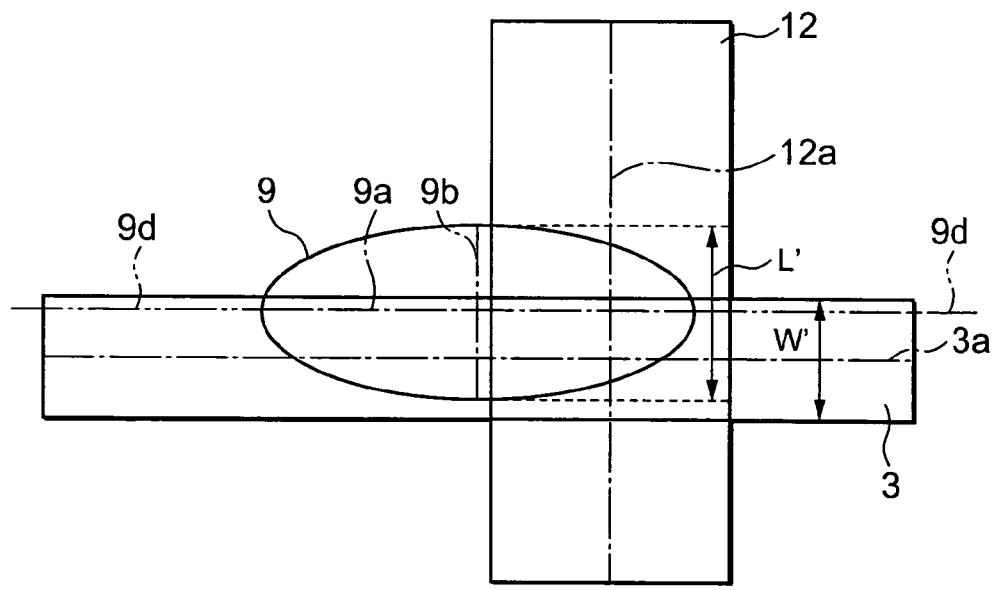
FIG. 22 is a plan view showing a variation example of the third embodiment of an MRAM memory cell according to the present invention.

In this embodiment, by adopting a similar technique to that of the bit line 12, it is possible to reduce a write current in the word line 3. As shown in FIG. 22, although the free ferromagnetic layer 9 is substantially symmetrical with regard to a plane of symmetry 9d which is perpendicular to the main surface 1a of a substrate 1 and has the major axis 9a on it, a write current in the word line 3 can be reduced by arranging the center line 3a of the word line 3 so as to be offset in the y-axis direction from the plane of symmetry 9d of the free ferromagnetic layer 9. Such an arrangement of the word line 3 reduces the magnitude of a write current required to flow in the word line 3 at the time of writing data due to a similar mechanism to that of reduction of a write current by means of the bit line 12 as described above. At this time, the word line 3 having a part which protrudes in the y-axis direction from one end of the minor axis 9b of the free ferromagnetic layer 9 and does not overlap the free ferromagnetic layer 9 is preferable since it makes smaller the magnitude of a write current required to flow in the word line 3 for writing data. Further, a fact that the width W' of the word line 3 in the y-axis direction is less than the length L' of the minor axis 9b of the free ferromagnetic layer 9 (namely, the width of the free ferromagnetic layer 9 in the y-axis direction) is preferable in that it makes smaller the magnitude of a write current required to flow in the word line 3 for writing data.

Figure 23:
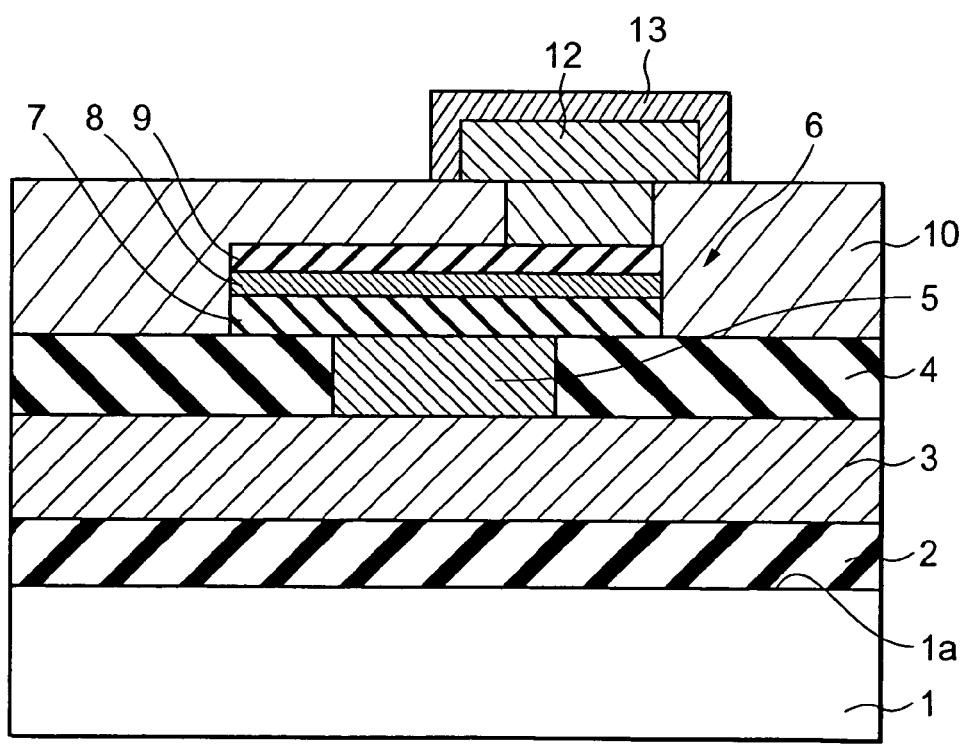
FIG. 23 is a sectional view showing another example of the third embodiment of an MRAM memory cell according to the present invention.

Furthermore, as shown in FIG. 23, it is preferable that a magnetic layer 13 having a high magnetic permeability is formed on the top face and side faces of the bit line 12. The magnetic layer 13 is typically formed out of permalloy. Such a structure concentrates a magnetic field generated by the bit line 12 on the free ferromagnetic layer 9 and makes smaller the magnitude of a write current required to flow in the word line 3 at the time of writing data.

FOURTH EMBODIMENT

FIG. 24 shows a fourth embodiment of an MRAM memory cell according to the present invention. In the fourth embodiment, separately from a read bit line 15 to be used in reading data, a write bit line 16 to be used in writing data is provided in a memory cell. Both the read bit line 15 and the write bit line 16 are formed on an interlayer insulator film 10. The read bit line 15 is electrically connected to a free ferromagnetic layer 9 of a magnetoresistance element 6 through a contact 14 penetrating the interlayer insulator film 10 to reach the free ferromagnetic layer 9. The write bit line 16 is electrically insulated from the magnetoresistance element 6.

Further, in the fourth embodiment, a contact 5 is removed, and a word line 3 and a fixed ferromagnetic layer 7 are electrically insulated from each other. The fixed ferromagnetic layer 7 extends in the x-direction and is also used as a read word line. The word line 3 is used exclusively in writing data.

In case that data is read from the memory cell, a specific voltage is applied between the fixed ferromagnetic layer 7 to be used as a read word line and the read bit line 15. Since the resistance value of the magnetoresistance element 6 varies according to the direction of spontaneous magnetization of the free ferromagnetic layer 9, namely, data stored in the said memory cell, an electric current flowing in the magnetoresistance element 6 varies according to the data stored in the said memory cell. The data stored in the said memory cell is discriminated on the basis of the current flowing in the magnetoresistance element 6.

In case that data is written into the memory cell, a write current is made to flow in the word line 3 in the x-axis direction and a write current is made to flow in the write bit line 16 in the y-axis direction according to the data to be written. The write current flowing in the word line 3 applies a magnetic field to the free ferromagnetic layer 9 in the y-axis direction. The magnetic coercive field in the free ferromagnetic layer 9 is made small by applying a magnetic field in the y-axis direction and the inversion of the free ferromagnetic layer 9 is facilitated. A write current made to flow in the write bit line 16 generates a magnetic field in the x-axis direction and inverts the spontaneous magnetization of the free ferromagnetic layer 9 according to the data to be written.

A fact that the write bit line 16 is electrically insulated from the read bit line 15 and the word line 3 is electrically insulated from the fixed ferromagnetic layer 7 functioning as a read word line is preferable in that it makes it possible to read and write data at the same time. Further, such a structure which is preferable in that this structure as well makes it possible to separately provide a selector (not illustrated) for selecting a read bit line 15 and a selector for selecting a write bit line 16, and separately provide a selector for selecting a write word line and a selector for selecting a read word line and thereby makes it possible to simplify circuits contained in these selectors.

In a similar manner to the bit line 12 of the third embodiment, the center line 16a of the write bit line 16 is arranged so as to be offset in the x-axis direction from the plane of symmetry 9c of the free ferromagnetic layer 9. The write bit line 16 has a part which protrudes in the x-axis direction from one end of the major axis 9a of the free ferromagnetic layer 9 in case of being seen from a direction perpendicular to the primary surface 1a of the substrate 1 and does not overlap the free ferromagnetic layer 9. Further, the width W of the write bit line 16 in the x-axis direction is narrower than the length of the major axis 9a of the free ferromagnetic layer 9 (namely, the length of the ferromagnetic layer 9 similarly to the bit line 12 of the first embodiment in the x-axis direction). Such an arrangement of the write bit line 16 makes it possible to write data by means of a smaller write current similarly to the bit line 11 of the first embodiment.

Providing the center line 16a of the write bit line 16 so as to be offset in the x-axis direction from the plane of symmetry 9c of the free ferromagnetic layer 9 is preferable in that it makes it possible to form both of the read bit line 15 and the write bit line 16 on the interlayer insulator film 10, namely, form the read bit line 15 and the write bit line 16 by means of a single wiring layer. According to arranging the center line 16a of the write bit line 16 so as to be offset in the x-axis direction from the plane of symmetry 9c of the free ferromagnetic layer 9, a space in which the write bit line 15 is to be arranged above the magnetoresistance element is generated on the interlayer insulator film 10. Arranging the write bit line 15 in this space makes it possible to form the read bit line 15 and the write bit line 16 by means of a single wiring layer. Also, by forming the read bit line 15 and the write bit line 16 of a single wiring layer, the manufacturing process can be simplified.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

What is claimed is:

1. A magnetic random access memory comprising:
   a substrate;
   a magnetoresistance element which includes a ferromagnetic layer having an invertible spontaneous magnetization, which varies in resistance according to a direction of said spontaneous magnetization, and is formed above said substrate; and a wiring which extends in a first direction and is used to make an electric current flow to generate a magnetic field to be applied to said magnetoresistance element, wherein said wiring is formed so as to pass through a first position which is closer to said substrate than said magnetoresistance element and does not overlap said magnetoresistance element when viewed from a direction perpendicular to a main surface of said substrate, and a second position being above said magnetoresistance element.

2. The magnetic random access memory according to claim 1, wherein a direction of said magnetic field is substantially the same direction as the direction of said spontaneous magnetization.

3. The magnetic random access memory according to claim 1, wherein said wiring is formed so as to pass through a third position closer to said substrate than said magnetoresistance element, and wherein said first position and said third position are located such that said magnetoresistance element is located between said first position and third position when viewed from a direction perpendicular to said main surface of said substrate.

4. The magnetic random access memory according to claim 1, further comprising:

a first insulating film formed so as to cover said substrate, and a second insulating film, wherein said magnetoresistance element is formed on said first insulating film, and wherein said second insulating film is formed on said first insulating film and joined to a side face of said magnetoresistance element to insulate said wiring and said magnetoresistance element from each other.

5. The magnetic random access memory according to claim 4, wherein said first insulating film has a wiring forming face and a magnetoresistance element forming face, wherein said magnetoresistance element forming face is located further from said substrate than said wiring forming face, wherein said magnetoresistance element is formed on said magnetoresistance element forming face, and wherein a part of said wiring is formed on said wiring forming face.

6. The magnetic random access memory according to claim 5, wherein said wiring comprises:

a first wiring portion extended along said wiring forming face so as to pass through said first position, a second wiring portion extended along a side face of said second insulating film substantially perpendicularly to said main surface of said substrate, and a third wiring portion extended along the upper face of said second insulating film so as to pass through said second position.

7. The magnetic random access memory according to claim 6, wherein the length of said second wiring portion is longer than the length of said third wiring portion.

8. The magnetic random access memory according to claim 5, wherein said wiring comprises:

a first wiring portion extended along said wiring forming face so as to pass through said first position, a second wiring portion extended along a side face of said second insulating film inclined to said main surface of said substrate, and a third wiring portion extended along the upper face of said second insulating film so as to pass through said second position.

9. A magnetic random access memory according to claim 1, further comprising another wiring extended in a second direction substantially perpendicular to said first direction, wherein said other wiring comprises:

a fourth wiring portion passing through between said magnetoresistance element and said substrate, a fifth wiring portion located further from said substrate than said fourth wiring portion, and a sixth wiring portion being provided between said fourth wiring portion and said fifth wiring portion and extended in a direction having a component perpendicular to the main surface of said substrate.

10. A magnetic random access memory according to claim 1, wherein said ferromagnetic layer is substantially symmetric with respect to a plane of symmetry being substantially perpendicular to said substrate, and wherein a centerline of said wiring is shifted to said plane of symmetry.

11. The magnetic random access memory according to claim 10, wherein said wiring has a portion which protrudes from an end of said ferromagnetic layer in a second direction perpendicular to said plane of symmetry toward said second direction and which does not overlap said ferromagnetic layer.

12. The magnetic random access memory according to claim 10, wherein a width of said wiring in the second direction perpendicular to said plane of symmetry is narrower than a length of said ferromagnetic layer in said second direction.

13. A magnetic random access memory comprising:

a substrate;

a magnetoresistance element being formed at an upper surface side of said substrate, having a spontaneous magnetization invertible in parallel or antiparallel with a first direction and being different in resistance according to the direction of said spontaneous magnetization; and a wiring which extends in a second direction substantially perpendicular to said first direction and is used for making an electric current flow to generate a magnetic field to be applied to said magnetoresistance element, wherein said wiring is formed so as to pass through a first position not overlapping said magnetoresistance element when viewed from the upper surface side of said substrate and a second position being above said magnetoresistance element, and wherein said first position is closer to said substrate than said second position.

* * * * *